(12) United States Patent
Feng et al.

(10) Patent No.: US 11,568,820 B2
(45) Date of Patent: Jan. 31, 2023

(54) DISPLAY PANEL, DISPLAY DEVICE, AND DRIVE METHOD

(71) Applicants: HEFEI BOE JOINT TECHNOLOGY CO., LTD., Hefei (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 203 days.

(21) Appl. No.: 16/966,205

(22) PCT Filed: Jan. 20, 2020

(86) PCT No.: PCT/CN2020/073281
§ 371 (c)(1),
(2) Date: Jul. 30, 2020

(87) PCT Pub. No.: WO2020/173262
PCT Pub. Date: Sep. 3, 2020

(65) Prior Publication Data
US 2021/0201810 A1  Jul. 1, 2021

(30) Foreign Application Priority Data

Feb. 28, 2019  (CN) .......................... 201910151531.3

(51) Int. Cl.
*G09G 3/3266* (2016.01)
*G09G 3/3233* (2016.01)
*G11C 19/28* (2006.01)

(52) U.S. Cl.
CPC ......... *G09G 3/3266* (2013.01); *G09G 3/3233* (2013.01); *G11C 19/287* (2013.01);
(Continued)

(58) Field of Classification Search
CPC ............... G09G 3/3266; G09G 3/3233; G09G 2300/0426; G09G 2300/0819;
(Continued)

(56) References Cited

U.S. PATENT DOCUMENTS 10,311,795 B2   6/2019   Chen et al.
10,366,651 B2   7/2019   Ha
(Continued)

FOREIGN PATENT DOCUMENTS

CN   205282054 U   6/2016
CN   106157896 A   11/2016
(Continued)

OTHER PUBLICATIONS

First Chinese Office Action from Chinese Patent Application No. 201910151531.3 dated Jul. 6, 2020.
(Continued)

*Primary Examiner* — Jeff Piziali
(74) *Attorney, Agent, or Firm* — Dilworth & Barrese, LLP.; Michael J. Musella, Esq.

(57) ABSTRACT

A display panel, a display device, and a drive method are provided. The display panel includes a plurality of sub-pixel units arranged in an array and a gate drive circuit, and the array includes N rows. The gate drive circuit includes a plurality of cascaded shift register units and N+1 output terminals arranged in sequence, each of the plurality of cascaded shift register units is configured to output a gate scan signal for driving at least two rows of sub-pixel units in the N rows of the array to work; pixel drive circuits of an (n)-th row of sub-pixel units are connected to an (n)-th
(Continued)

output terminal of the gate drive circuit to receive the gate scan signal as a scan drive signal, and sensing circuits of the (n)-th row of sub-pixel units are connected to an (n+1)-th output terminal of the gate drive circuit.

19 Claims, 17 Drawing Sheets

(52) U.S. Cl.
CPC ............... *G09G 2300/0426* (2013.01); *G09G 2300/0819* (2013.01); *G09G 2300/0842* (2013.01); *G09G 2310/0286* (2013.01); *G09G 2310/061* (2013.01); *G09G 2310/08* (2013.01); *G09G 2320/0233* (2013.01)

(58) Field of Classification Search
CPC ... G09G 2300/0842; G09G 2310/0286; G09G 2310/061; G09G 2310/08; G09G 2320/0233; G09G 2320/0295; G11C 19/287; G11C 19/28
See application file for complete search history.

(56) References Cited

U.S. PATENT DOCUMENTS

| | | | |
|---|---|---|---|
| 10,629,124 B2 | 4/2020 | Li et al. | |
| 10,777,134 B2 | 9/2020 | Yuan et al. | |
| 2008/0231562 A1 | 9/2008 | Kwon | |
| 2014/0022289 A1* | 1/2014 | Lee | G09G 3/006 345/76 |
| 2015/0379937 A1* | 12/2015 | Kim | G09G 3/3275 345/691 |
| 2017/0061865 A1* | 3/2017 | Park | G09G 3/325 |
| 2018/0130402 A1 | 5/2018 | Bang et al. | |
| 2018/0293944 A1 | 10/2018 | Kim et al. | |
| 2018/0337682 A1* | 11/2018 | Takasugi | H03K 21/18 |
| 2019/0206294 A1 | 7/2019 | Tian et al. | |
| 2021/0201804 A1 | 7/2021 | Feng et al. | |

FOREIGN PATENT DOCUMENTS

| | | |
|---|---|---|
| CN | 106960658 A | 7/2017 |
| CN | 107657923 A | 2/2018 |
| CN | 108154835 A | 6/2018 |
| CN | 108682398 A | 10/2018 |
| CN | 108806597 A | 11/2018 |
| CN | 109166527 A | 1/2019 |
| CN | 109166529 A | 1/2019 |
| CN | 109243347 A | 1/2019 |
| CN | 109935212 A | 6/2019 |
| KR | 1020160007898 A | 1/2016 |
| KR | 1020170049667 A | 5/2017 |
| KR | 1020170064142 A | 6/2017 |

OTHER PUBLICATIONS

Extended European Search Report from Application No. 20763429.6 dated Jul. 11, 2022.

* cited by examiner

DISPLAY PANEL, DISPLAY DEVICE, AND DRIVE METHOD

The present application claims priority of Chinese Patent Application No. 201910151531.3, filed on Feb. 28, 2019, the present disclosure of which is incorporated herein by reference in its entirety as part of the present application.

TECHNICAL FIELD

Embodiments of the present disclosure relate to a display panel, a display device, and a drive method.

BACKGROUND

In a field of display, especially in OLED (Organic Light-Emitting Diode) display panels, gate drive circuits are currently generally integrated in a gate IC. In IC design, an area of a chip is a main factor affecting the cost of the chip. How to effectively reduce the area of the chip is a key consideration for technical developers.

SUMMARY

At least one embodiment of the present disclosure provides a display panel, which includes a plurality of sub-pixel units arranged in an array and a gate drive circuit, wherein the array includes N rows; wherein each of the plurality of sub-pixel units includes a light-emitting unit, a pixel drive circuit configured to drive the light-emitting unit to emit light, and a sensing circuit configured to sense the pixel drive circuit; the gate drive circuit includes a plurality of cascaded shift register units and N+1 output terminals arranged in sequence, each of the plurality of cascaded shift register units is configured to output a gate scan signal for driving at least two rows of sub-pixel units in the N rows of the array to work; and pixel drive circuits of an (n)-th row of sub-pixel units are connected to an (n)-th output terminal of the gate drive circuit to receive the gate scan signal as a scan drive signal, and sensing circuits of the (n)-th row of sub-pixel units are connected to an (n+1)-th output terminal of the gate drive circuit to receive the gate scan signal as a sensing drive signal, wherein, $1 \leq n \leq N$, N is an integer greater than or equal to 2.

For example, in the display panel provided by some embodiments of the present disclosure, each of the plurality of cascaded shift register units is configured to output a gate scan signal for driving two rows of sub-pixel units in the N rows of the array to work; an (x)-th stage of shift register unit includes a first output terminal and a second output terminal which serve as a (2x−1)-th output terminal and a (2x)-th output terminal among the N+1 output terminals arranged in sequence, respectively, the first output terminal of the (x)-th stage of shift register unit is connected to pixel drive circuits of a (2x−1)-th row of sub-pixel units to provide the gate scan signal as the scan drive signal, and is further connected to sensing circuits of a (2x−2)-th row of sub-pixel units to provide the gate scan signal as a sensing drive signal, the second output terminal of the (x)-th stage of shift register unit is connected to pixel drive circuits of a (2x)-th row of sub-pixel units to provide the gate scan signal as the scan drive signal, and is further connected to sensing circuits of the (2x−1)-th row of sub-pixel units to provide the gate scan signal as the sensing drive signal; and in a case where N is an odd number greater than 2, $1 \leq x \leq (N-1)/2$, and in a case where N is an even number greater than or equal to 2, $1 \leq x \leq N/2$.

For example, in the display panel provided by some embodiments of the present disclosure, the pixel drive circuit of each of the plurality of sub-pixel units includes a data write circuit and a drive circuit; the drive circuit is connected to the data write circuit, the light-emitting unit, and the sensing circuit, and is configured to control a drive current for driving the light-emitting unit to emit light; the data write circuit is configured to receive the scan drive signal and, in response to the scan drive signal, write a data signal to the drive circuit; and the sensing circuit is further connected to the drive circuit and configured to receive the sensing drive signal and, in response to the sensing drive signal, write a reference voltage signal to the drive circuit, or read a sensing voltage signal from the drive circuit.

For example, in the display panel provided by some embodiments of the present disclosure, the pixel drive circuit further includes a charge storage circuit, and the charge storage circuit is further connected to the light-emitting unit and configured to store the data signal and the reference voltage signal which are written.

For example, the display panel provided by some embodiments of the present disclosure, includes N+1 gate lines arranged in sequence, wherein the N+1 gate lines are connected to the N+1 output terminals of the gate drive circuit in one-to-one correspondence, respectively; data write circuits of the (2x−1)-th row of sub-pixel units are connected to the first output terminal of the (x)-th stage of shift register unit through a (2x−1)-th gate line; and sensing circuits of the (2x−1)-th row of sub-pixel units and data write circuits of the (2x)-th row of sub-pixel units are connected to the second output terminal of the (x)-th stage of shift register unit through a (2x)-th gate line.

For example, in the display panel provided by some embodiments of the present disclosure, the array includes M columns, and the display panel further includes M data lines and M sensing lines; data write circuits in an (m)-th column of sub-pixel units are connected to an (m)-th data line to receive the data signal; and sensing circuits in the (m)-th column of sub-pixel units are connected to an (m)-th sensing line to receive the reference voltage signal or output the sensing voltage signal, wherein $1 \leq m \leq M$, M is an integer greater than or equal to 2.

For example, in the display panel provided by some embodiments of the present disclosure, the data write circuit includes a scan transistor, the drive circuit includes a drive transistor, the sensing circuit includes a sensing transistor, and the charge storage circuit includes a storage capacitor; a gate electrode of the scan transistor is connected to a first gate line of the N+1 gate lines to receive the scan drive signal, a first electrode of the scan transistor is connected to one of the M data lines to receive the data signal, and a second electrode of the scan transistor is connected to a gate electrode of the drive transistor; a first electrode of the drive transistor is connected to a first voltage terminal to receive a first drive voltage for generating the drive current, a second electrode of the drive transistor is connected to a first electrode of the sensing transistor; a gate electrode of the sensing transistor is connected to a second gate line of the N+1 gate lines to receive the sensing drive signal, and a second electrode of the sensing transistor is configured to be connected to one of the M sensing lines to receive the reference voltage signal or output the sensing voltage signal; and a first electrode of the storage capacitor is connected to the gate electrode of the drive transistor, and a second electrode of the storage capacitor is connected to the second electrode of the drive transistor.

For example, in the display panel provided by some embodiments of the present disclosure, each of the plurality of shift register units includes a first input circuit, a second input circuit, and an output circuit; the first input circuit is connected to a first node and configured to, in response to a first input signal, control a level of the first node; the output circuit is connected to the first node and configured to, under control of the level of the first node, output a first output signal as the gate scan signal from the first output terminal and output a second output signal as the gate scan signal from the second output terminal; and the second input circuit is connected to the first node and is configured to, under control of a selection control signal and a second input signal, control the level of the first node.

For example, in the display panel provided by some embodiments of the present disclosure, the output circuit further includes a shift output terminal, and the output circuit is configured to output a shift signal to a shift register unit cascaded with the (x)-th stage of shift register unit.

For example, in the display panel provided by some embodiments of the present disclosure, the output circuit includes a first output transistor, a second output transistor, a third output transistor, a second capacitor, and a third capacitor; a gate electrode of the first output transistor is connected to the first node, a first electrode of the first output transistor is connected to a first clock signal terminal to receive a first clock signal, and a second electrode of the first output transistor is connected to the first output terminal to output the first output signal; a gate electrode of the second output transistor is connected to the first node, a first electrode of the second output transistor is connected to a second clock signal terminal to receive a second clock signal, and a second electrode of the second output transistor is connected to the second output terminal to output the second output signal; a gate electrode of the third output transistor is connected to the first node, a first electrode of the third output transistor is connected to a third clock signal terminal to receive a third clock signal, and a second electrode of the third output transistor is connected to the shift output terminal to output the shift signal; a first terminal of the second capacitor is connected to the first clock signal terminal, and a second terminal of the second capacitor is connected to the first output terminal; and a first terminal of the third capacitor is connected to the second clock signal terminal, and the second terminal of the third capacitor is connected to the second output terminal.

For example, in the display panel provided by some embodiments of the present disclosure, each of the plurality of shift register units further includes a first control circuit and a first noise reduction circuit; the first control circuit is connected to the first node and a second node, and is configured to, under control of the level of the first node and a second voltage, control a level of the second node; and the first noise reduction circuit is connected to the second node, the first node, the first output terminal, the second output terminal, and the shift output terminal, and is configured to, under control of the level of the second node, reset the first node, the first output terminal, the second output terminal, and the shift output terminal.

For example, in the display panel provided by some embodiments of the present disclosure, each of the plurality of shift register units further includes a second control circuit and a third control circuit; the second control circuit is connected to a second node, and is configured to, in response to a fourth clock signal, control a level of the second node; and the third control circuit is connected to the second node, and is configured to, in response to the first input signal, control the level of the second node.

For example, in the display panel provided by some embodiments of the present disclosure, each of the plurality of shift register units further includes a first reset circuit and a second reset circuit; the first reset circuit is connected to the first node, and is configured to, in response to a display reset signal, reset the first node; and the second reset circuit is connected to the first node, and is configured to, in response to a global reset signal, reset the first node.

For example, in the display panel provided by some embodiments of the present disclosure, the second input circuit includes a selection control circuit, a third input circuit, and a transmission circuit; the selection control circuit is connected to a third node and is configured to, in response to the selection control signal, control a level of the third node by a second input signal and maintain the level of the third node; the third input circuit is connected to the third node and a fourth node, and is configured to, under control of the level of the third node, control a level of the fourth node; and the transmission circuit is electrically connected to the first node and the fourth node, and is configured to, under control of the level of the fourth node or a first transmission signal, control the level of the first node.

For example, in the display panel provided by some embodiments of the present disclosure, the second input circuit further includes a common reset circuit, and the common reset circuit is electrically connected to the fourth node and the second node, and is configured to, under control of the level of the second node, reset the fourth node.

For example, in the display panel provided by some embodiments of the present disclosure, a first stage of the shift register unit includes a first output terminal and a second output terminal which serve as a first output terminal and a second output terminal among the N+1 output terminals arranged in sequence, respectively, the first output terminal of the first stage of shift register unit is connected to pixel drive circuits of a first row of sub-pixel units to provide the gate scan signal as the scan drive signal; and the second output terminal of the first stage of shift register unit is connected to pixel drive circuits of a second row of sub-pixel units to provide the gate scan signal as the scan drive signal, and is connected to sensing circuits of the first row of sub-pixel units to provide the gate scan signal as the sensing drive signal.

For example, in the display panel provided by some embodiments of the present disclosure, in a case where N is an even number greater than or equal to 2, a last stage of shift register unit includes a first output terminal which serves as an (N+1)-th output terminal among the N+1 output terminals arranged in sequence, and is connected to sensing circuits of a last row of sub-pixel units to provide the gate scan signal as the sensing drive signal; and in a case where N is an odd number greater than or equal to 2, the last stage of shift register unit includes a first output terminal and a second output terminal which serve as an (N)-th output terminal and the (N+1)-th output terminal among the N+1 output terminals arranged in sequence, respectively, the first output terminal of the last stage of shift register unit is connected to pixel drive circuits of an (N)-th row of sub-pixel units to provide the gate scan signal as the scan drive signal, and is connected to sensing circuits of an (N−1)-th row of sub-pixel units to provide the gate scan signal as the sensing drive signal, and the second output terminal of the last stage of shift register unit is connected to sensing circuits of the last row of sub-pixel units to provide the gate scan signal as the sensing drive signal.

At least one embodiment of the present disclosure further provides a display device, which includes the display panel according to any one of embodiments of the present disclosure.

At least one embodiment of the present disclosure further provides a drive method for driving a display panel, which includes a display phase of one frame and a blanking phase of one frame, wherein in the display phase, the gate drive circuit sequentially outputs gate scan signals to the N rows of sub-pixel units, so that pixel drive circuits in the N rows of sub-pixel units drive light-emitting units in the N rows of sub-pixel units to emit light, respectively; and in the blanking phase, an (i)-th row of sub-pixel units are randomly selected from the N rows of sub-pixel units, so that sensing circuits in the (i)-th row of sub-pixel units sense, wherein $1 \leq i \leq N$.

For example, in the drive method provided by some embodiments of the present disclosure, in the display phase, a drive cycle of each row of sub-pixel units in the N rows of sub-pixel units includes a data write phase, a holding phase, and a light-emitting phase, and the pixel drive circuit includes a data write circuit, a drive circuit, and a charge storage circuit, in the data write phase, the data write circuit and the sensing circuit are turned on, and a data signal and a reference voltage signal are respectively written through the data write circuit and the sensing circuit; in the holding phase, the data write circuit is turned off, and the sensing circuit is turned on, so that the charge storage circuit holds the data signal and the reference voltage signal; and in the light-emitting phase, the data write circuit and the sensing circuit are turned off, the drive circuit is turned on, and the drive circuit drives the light-emitting unit to emit light according to the data signal.

For example, in the drive method provided by some embodiments of the present disclosure, in the blanking phase, a drive cycle of an (i)-th row of sub-pixel units includes a reset phase, a resetting phase, a charging phase, and a sensing phase, and the pixel drive circuit includes a data write circuit, a drive circuit, and a charge storage circuit, in a case of performing sensing on the (i)-th row of sub-pixel units, in the reset phase, drive circuits in an (i−1)-th row of sub-pixel units are turned off; in the resetting phase, data write circuits and sensing circuits in the (i)-th row of sub-pixel units are turned on, and a data signal and a reference voltage signal are respectively written through the data write circuit and the sensing circuit to turn on drive circuits in the (i)-th row of sub-pixel unit; in the charging phase, the data write circuits in the (i)-th row of sub-pixel unit are turned off, the sensing circuits in the (i)-th row of sub-pixel units are turned on, and the sensing circuits are charged by the drive circuits; and in the sensing phase, the data write circuits in the (i)-th row of sub-pixel units are turned off, the sensing circuits in the (i)-th row of sub-pixel units are turned on, and a sensing voltage signal is output through the sensing circuits.

For example, in the drive method provided by some embodiments of the present disclosure, in the reset phase, data write circuits and sensing circuits in the (i−1)-th row of sub-pixel units are turned on, and correction voltages are respectively written through the data write circuits and the sensing circuits to turn off drive circuits in the (i−1)-th t row of sub-pixel units.

BRIEF DESCRIPTION OF THE DRAWINGS

In order to clearly illustrate the technical solutions of the embodiments of the disclosure, the drawings of the embodiments will be briefly described in the following; and it is obvious that the described drawings are only related to some embodiments of the disclosure and thus are not limitative to the disclosure.

DETAILED DESCRIPTION

Figure 1A:
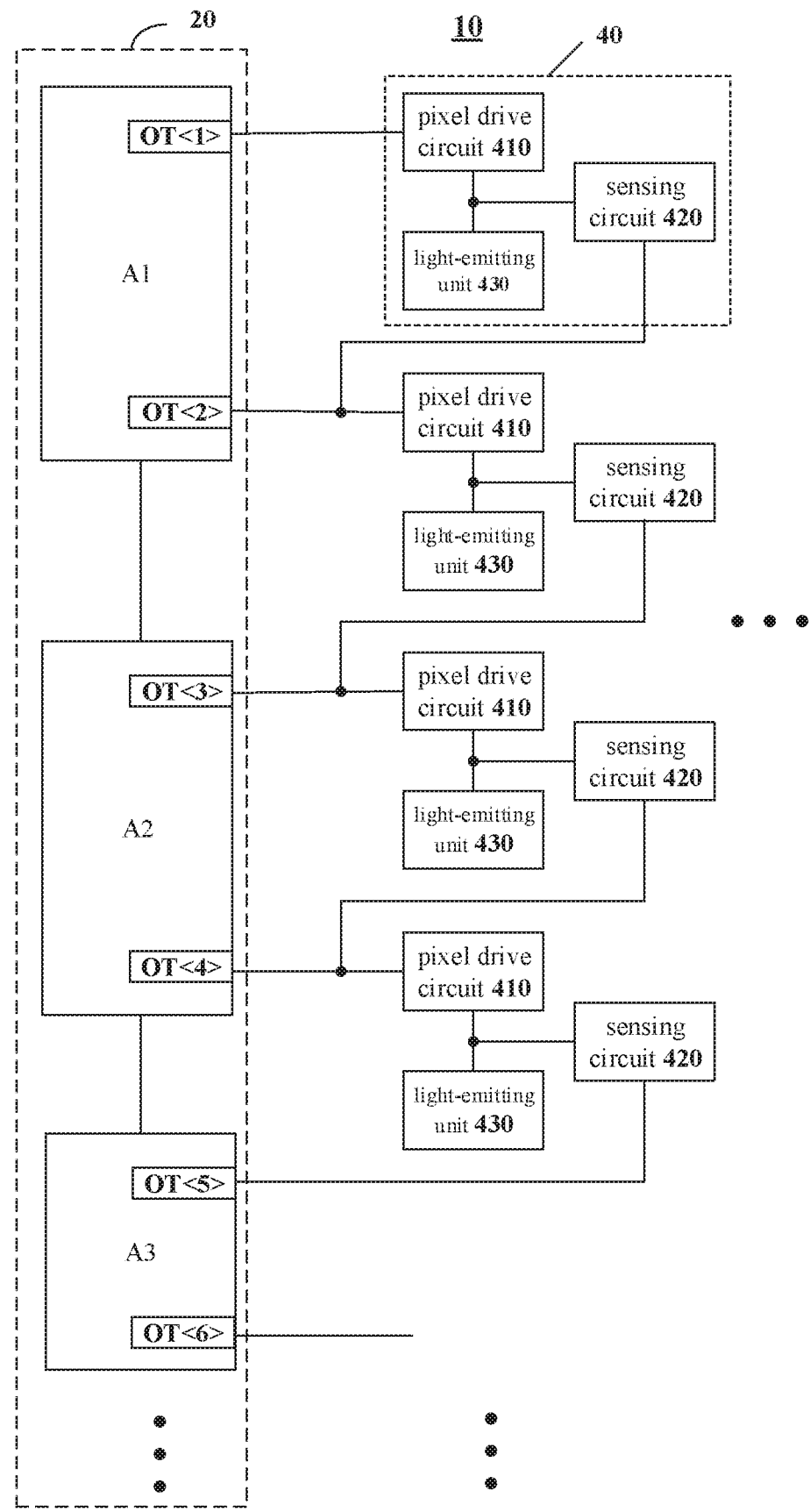
FIG. 1A is a schematic diagram of a display panel provided by some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. Also, the terms such as "a," "an" or "the" etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At present, a gate drive circuit for OLED is usually composed of three sub-circuits, which are a detection circuit, a display circuit, and a connection circuit (or a gate circuit) outputting a composite pulse of the detection circuit and the display circuit. Such a circuit structure is very complex and cannot meet the requirement of a high-resolution narrow frame of a display panel.

When compensating the sub-pixel units in the OLED display panel, in addition to an internal compensation by setting a pixel compensation circuit in each of plurality of sub-pixel units, an external compensation can also be performed by setting a sensing transistor. When performing the external compensation, the gate drive circuit composed of the shift register unit needs to provide drive signals for a scan transistor and a sensing transistor to the sub-pixel units in the display panel, respectively, for example, a scan drive signal for the scan transistor is provided in a display phase of one frame, and a sensing drive signal for the sensing transistor is provided in a blanking phase of one frame.

In an external compensation method, sensing drive signals output by the gate drive circuit are sequentially scanned row by row, for example, the sensing drive signal for a first row of the sub-pixel units in the display panel is output in the blanking phase of a first frame, the sensing drive signal for a second row of the sub-pixel units in the display panel is output in the blanking phase of a second frame, and so on, and the sensing drive signals are sequentially output row by row in each frame at the frequency of outputting the sensing drive signal corresponding to one row of sub-pixel units in one frame, that is, a row by row sequential compensation of the display panel is completed.

However, when the above-mentioned row by row sequential compensation method is adopted, poor display may occur. At first, there is a scan line moving row by row in the process of scanning and displaying of a plurality of frames, at second, the difference in time points for the external compensation will cause the brightness difference in different areas of the display panel to be relatively large. For example, when performing the external compensation on a 100th row of the sub-pixel units of the display panel, although a 10th row of sub-pixel units of the display panel have been externally compensated, the light emission brightness of the 10th row of the sub-pixel units may have changed at this time, for example, the light emission brightness is reduced, thus causing uneven brightness in different areas of the display panel, which is more obvious in large-sized display panels.

As described above, in the case where the gate drive circuit drives a plurality of rows of sub-pixel units in a display panel, if the external compensation is required to be realized, the gate drive circuit is required to output not only the scan drive signal for the display phase, but also the sensing drive signal for the blanking phase. For example, for the display panel including N rows of sub-pixel units, the gate drive circuit requires to be provided with 2N output terminals. In this case, the area occupied by the gate drive circuit may be relatively large, thus the size of the bezel of the display device adopting the gate drive circuit is relatively large, and it is difficult to increase the PPI (pixels per inch) of the display device.

Some embodiments of the present disclosure provides a display panel, which includes a plurality of sub-pixel units arranged in an array and a gate drive circuit, the array includes N rows; each of the plurality of sub-pixel units includes a light-emitting unit, a pixel drive circuit configured to drive the light-emitting unit to emit light, and a sensing circuit configured to sense the pixel drive circuit; the gate drive circuit includes a plurality of cascaded shift register units and N+1 output terminals arranged in sequence, each of the plurality of cascaded shift register units is configured to output a gate scan signal for driving at least two rows of sub-pixel units in the N rows of the array to work; and pixel drive circuits of an (n)-th row of sub-pixel units are connected to an (n)-th output terminal of the gate drive circuit to receive the gate scan signal as a scan drive signal, and sensing circuits of the (n)-th row of sub-pixel units is connected to an (n+1)-th output terminal of the gate drive circuit to receive the gate scan signal as a sensing drive signal, $1 \leq n \leq N$, N is an integer greater than or equal to 2.

Some embodiments of the present disclosure also provide a display device and a drive method corresponding to the display panel.

According to the display panel, the display device, and the drive method provided by the above embodiments of the present disclosure, adjacent at least two rows of sub-pixel units share the gate scan signal output by the gate drive circuit, and each of the plurality of cascaded shift register units included in the gate drive circuit can output a plurality of gate scan signals, and the plurality of gate scan signals are used for driving a plurality of rows of sub-pixel units in N rows to work, so that the size of the bezel of the display device adopting the gate drive circuit can be reduced, and the PPI of the display device can be improved. Under this case, the display panel and the corresponding display device can also realize random compensation, thus avoiding the problem of poor display, such as scan lines and uneven display brightness caused by the row by row sequential compensation.

It should be noted that in the embodiments of the present disclosure, a random compensation refers to the external compensation method different from the row-by-row sequential compensation, and the sensing drive signals corresponding to any row of sub-pixel units in the display panel can be randomly output in the blanking phase of a certain frame. The following embodiments are the same as the above and will not be described again.

In addition, in the embodiments of the present disclosure, in order to express clearly and concisely, the definition of "one frame", "every frame" or "a certain frame" includes a display phase and a blanking phase which are sequentially performed, for example, in the display phase, the gate drive circuit outputs the scan drive signals which can drive the plurality of rows of sub-pixel units in the display panel to complete scanning and displaying of a complete image from a first row to a last row, and in the blanking phase, the gate drive circuit outputs a sensing drive signal which can be used to drive sensing transistors in a row of sub-pixel units in the display panel to complete the external compensation of the current row of sub-pixel units.

Embodiments of the present disclosure and examples thereof will be described in detail below with reference to the accompanying drawings.

Some embodiments of the present disclosure provide a display panel 10. As shown in FIG. 1A, the display panel 10 includes a plurality of sub-pixel units 40 arranged in an array and a gate drive circuit 20. The array includes N rows and M columns, and N and M are integers greater than or equal to 2. It should be noted that, FIG. 1A only exemplarily shows four rows and one column of sub-pixel units, and the embodiments of the present disclosure include but are not limited to this case. The display panel 10 provided by the embodiments of the present disclosure may also include more rows and more columns of sub-pixel units 40.

As shown in FIG. 1A, each of the plurality of sub-pixel units 40 includes a light-emitting unit 430, a pixel drive circuit 410 configured to drive the light-emitting unit 430 to emit light, and a sensing circuit 420 configured to sense the pixel drive circuit 410. For example, in a display phase of one frame, the pixel drive circuit 410 in each of the plurality of sub-pixel units 40 may drive the light-emitting unit 430 to emit light. In a blanking phase of one frame, the sensing circuit 420 in each of the plurality of sub-pixel units 40 can sense the pixel drive circuit 410, so that an external compensation for each of the plurality of sub-pixel units 40 can be realized according to a sensing result.

For example, the gate drive circuit 20 includes a plurality of cascaded shift register units (for example, including a first stage of shift register unit A1, a second stage of shift register unit A2, a third stage of shift register unit A3, etc., which are cascaded, as shown in FIG. 1A), and N+1 output terminals OT (OT<1>, OT<2>, OT<3>, OT<4>, and OT<5> etc., as shown in FIG. 1A) arranged in sequence.

For example, the gate drive circuit is configured to output gate scan signals that turn on N rows of sub-pixel units of the array row by row through the N+1 output terminals OT arranged in sequence. For example, the gate scan signals respectively output by the N+1 output terminals OT of the gate drive circuit 20 are continuous in timing, so that the N rows of sub-pixel units of the array can be turned on row by row. It should be noted that the gate drive circuit 20 in FIG. 1A and FIG. 1B only exemplarily shows six output terminals. The embodiments of the present disclosure include but are not limited to this case, and the gate drive circuit 20 in the embodiments of the present disclosure may be provided with more output terminals according to requirements.

Figure 1B:
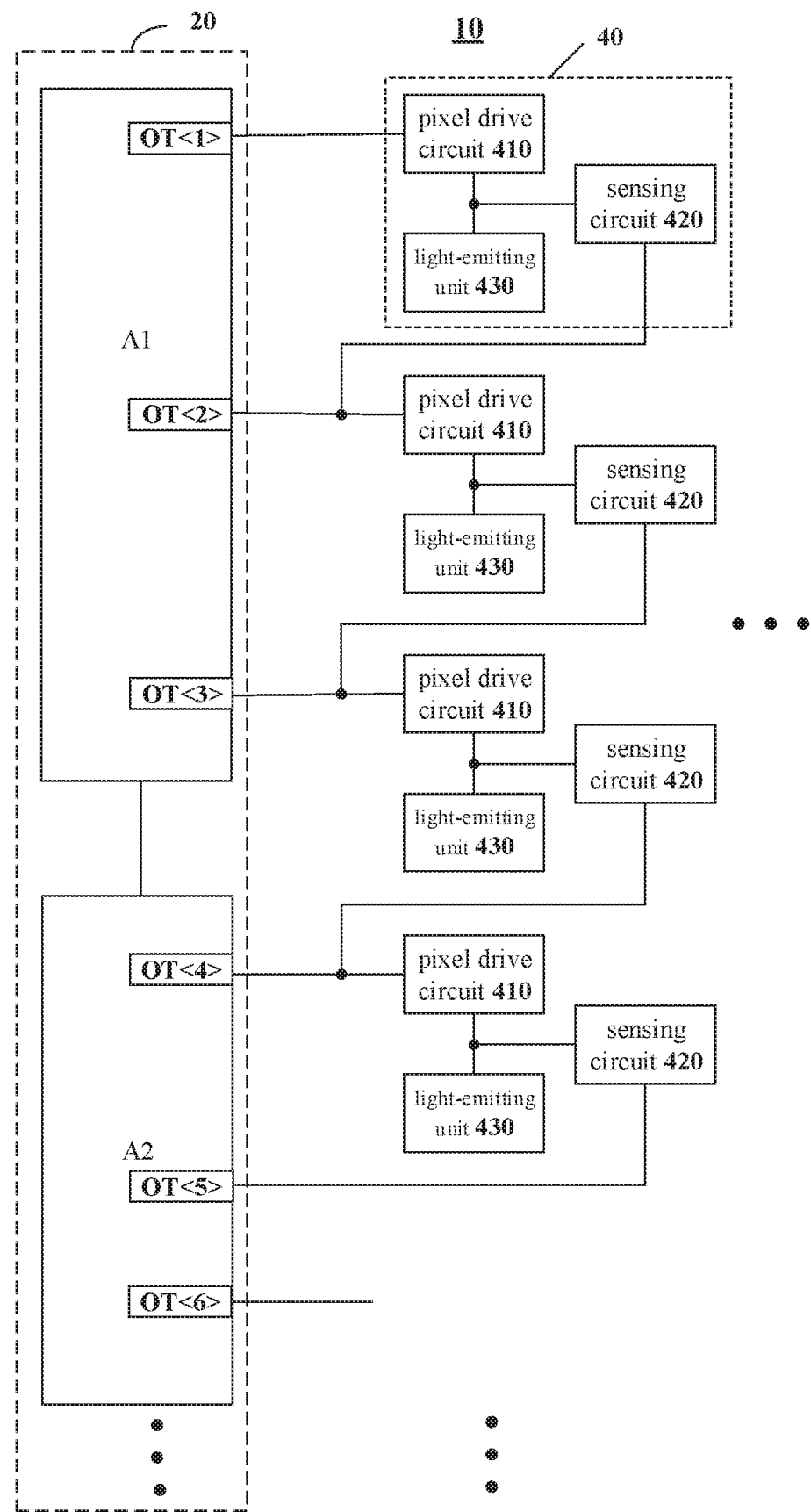
FIG. 1B is a schematic diagram of another display panel provided by some embodiments of the present disclosure.

As shown in FIG. 1A and FIG. 1B, pixel drive circuits 410 of an (n)-th row (1≤n≤N) of sub-pixel units are connected to an (n)-th output terminal of the gate drive circuit 20 to receive a gate scan signal as a scan drive signal, and sensing circuits 420 of the (n)-th row of sub-pixel units and is connected to an (n+1)-th output terminal of the gate drive circuit to receive a gate scan signal as a sensing drive signal.

For example, pixel drive circuits 410 of the first row of sub-pixel units and a first output terminal OT<1> of the gate drive circuit 20 are connected to receive the gate scan signal served as the scan drive signal. For example, in a display phase of one frame, the scan drive signal can be used to turn on data write circuits in the pixel drive circuits 410 to write a corresponding data signal into the pixel drive circuits 410. Sensing circuits 420 of the first row of sub-pixel units and the second output terminal OT<2> of the gate drive circuit are connected to receive the gate scan signal as the sensing drive signal. For example, in a blanking phase of one frame, the sensing drive signal may be used to turn on the sensing circuits 420. Pixel drive circuits 410 of the second row of sub-pixel units and the second output terminal OT<2> of the gate drive circuit 20 are connected to receive the gate scan signal as the scan drive signal. Sensing circuits 420 of the second row of sub-pixel units and the third output terminal OT<3> of the gate drive circuit 20 are connected to receive the gate scan signal as the sensing drive signal. The connection relationship between the third row of sub-pixel units, the fourth row of sub-pixel units, and the gate drive circuit 20, is similar to the connection relationship between the first row of sub-pixel units, the second row of sub-pixel units, and the gate drive circuit 20, which will not be described here again.

As shown in FIG. 1A, the plurality of rows of sub-pixel units and the gate drive circuit 20 in the display panel provided by the embodiments of the present disclosure adopt the connection relationship as described above, so that the sensing circuits 420 of the (n)-th row of sub-pixel units and the pixel drive circuits 410 of the (n+1)-th row of sub-pixel units are both connected to the (n+1)-th output terminal of the gate drive circuit 20. Therefore, the sensing circuits 420 of the (n)-th row of sub-pixel units and the pixel drive circuits 410 of the (n+1)-th row of sub-pixel units can share the gate scan signal output by the (n+1)-th output terminal, thereby reducing an amount of output terminals of the gate drive circuit 20, further reducing the size of the bezel of the display device by adopting the display panel 10, and improving the PPI of the display device.

For example, each of the plurality of cascaded shift register units may include at least two output terminals, which may be served as at least two sequentially arranged output terminals OT of the N+1 output terminals, and are configured to output gate scan signals that drive at least two rows of sub-pixel units among N rows of the array to work. For example, in some examples, in the case where each of the plurality of cascaded shift register units is configured to output the gate scan signal that drives two rows of sub-pixel units among N rows of the array to work, as shown in FIG. 1A, each of the plurality of cascaded shift register units includes two output terminals to output two rows of gate scan signals to drive two rows of sub-pixel units to work. For example, one of the two output terminals outputs the gate scan signal for driving the (n)-th row of sub-pixel units, and another of the two output terminals outputs the gate scan signal for driving the (n+1)-th row of sub-pixel units.

For example, in the example as shown in FIG. 1A, in the case where a (x)-th (in the case where N is an odd number greater than 2, 1≤x≤(N−1)/2; in the case where N is an even number greater than or equal to 2, 1≤x≤N/2) stage of shift register unit includes a first output terminal and a second output terminal which respectively serve as a (2x−1)-th output terminal and a (2x)-th output terminal among the N+1 output terminals arranged in sequence, the first output terminal of the (x)-th stage of shift register unit is connected to pixel drive circuits of a (2x−1)-th row of sub-pixel units to provide the gate scan signal as the scan drive signal, and is also connected to sensing circuits of a (2x−2)-th row of sub-pixel units to provide the gate scan signal as the sensing drive signal, and the second output terminal of the (x)-th stage of shift register unit is connected to pixel drive circuits of a (2x)-th row of sub-pixel units to provide the gate scan signal as the scan drive signal, and is also connected to sensing circuits of the (2x−1)-th row of sub-pixel units to provide the gate scan signal as the sensing drive signal.

For example, as shown in FIG. 1A, a first stage of the shift register unit includes a first output terminal and a second output terminal which respectively serve the first output terminal OT<1> and the second output terminal OT<2> among the N+1 output terminals arranged in sequence to respectively output gate scan signals for driving a first row of sub-pixel units and a second row of the sub-pixel units through the first output terminal and the second output terminal. A second stage of shift register unit includes a first output terminal and a second output terminal which are respectively served as the third output terminal OT<3> and the fourth output terminal OT<4> among the N+1 output terminals arranged in sequence to respectively output gate scan signals for driving a third row of sub-pixel units and a fourth row of sub-pixel units through the first output terminal and the second output terminal, and so on, and the structures of other stages of shift register units are similar to this structure and will not be repeated here.

For example, in the example as shown in FIG. 1A, the first output terminal of the first stage of shift register unit is connected to the pixel drive circuits of the first row of sub-pixel units to provide the gate scan signal as the scan drive signal, the second output terminal of the first stage of shift register unit is connected to the pixel drive circuits of the second row of sub-pixel units to provide the gate scan signal as the scan drive signal, and is also connected to the sensing circuits of the first row of sub-pixel units to provide the gate scan signal as the sensing drive signal.

For example, in the case where N is an even number greater than or equal to 2, the last stage of shift register unit of the gate drive circuit 20 includes a first output terminal as an (N+1)-th output terminal among the N+1 output terminals arranged in sequence, and is connected to the sensing circuits of the last row of sub-pixel units to provide the gate scan signal as the sensing drive signal. For example, in order to keep the structure of each of the plurality of cascaded shift register units consistent, the last stage of shift register unit may further include a second output terminal, that is, the gate drive circuit may further include N+2 output terminals, but the second output terminal is not connected to sub-pixel units and does not output an output signal.

For example, in the case where N is an odd number greater than 2, the last stage of shift register unit includes a first output terminal and a second output terminal which serve as the (N)-th output terminal and the (N+1)-th output terminal among the N+1 output terminals arranged in sequence, respectively, the first output terminal is connected to the pixel drive circuits of the (N)-th row of sub-pixel units to provide the gate scan signal as the scan drive signal, and is connected to the sensing circuits of the (N−1)-th row of sub-pixel units to provide the gate scan signal served as the sensing drive signal, and the second output terminal is connected to the sensing circuits of the last row of sub-pixel units to provide the gate scan signal as the sensing drive signal.

It should be noted that, because the first output terminal of the first stage of shift register unit drives only the pixel drive circuits of the first row of sub-pixel units, in the case where N is an even number greater than or equal to 2, the first output terminal of the last stage of shift register unit drives only the sensing drive circuits of the last row of sub-pixel units, and in the case where N is an odd number greater than 2, the second output terminal of the last stage of shift register unit drives only the sensing drive circuit of the last row of sub-pixel units. That is, these output terminals are equivalent to drive only one load, while the first output terminal and the second output terminal of the shift register units at other stages both drive the pixel drive circuits of one row of sub-pixel units and the sensing drive circuits of the other rows of sub-pixel units, that is, they are equivalent to drive two loads. Therefore, in order to avoid uneven display brightness of the display panel due to inconsistent drive loads, in some embodiments of the present disclosure, the first row of sub-pixel units and the last row of sub-pixel units may be set not to be used for display.

For example, in other examples, in the case where each of the plurality of cascaded shift register units is configured to output gate scan signals that drive three rows of sub-pixel units among the N rows of the array to work, as shown in FIG. 1B, each of the plurality of cascaded shift register units includes three output terminals to output three rows of gate scan signals to drive the three rows of sub-pixel units to work.

For example, in the example as shown in FIG. 1B, the (x)-th stage of shift register unit includes a first output terminal, a second output terminal, and a third output terminal which serve as a (3x−2)-th output terminal, a (3x−1)-th output terminal, and a (3x)-th output terminal among the N+1 output terminals arranged in sequence, and the connection relationship of the first output terminal, the second output terminal, the third output terminal, and sub-pixel units is similar to the connection relationship of each stage of the shift register units in FIG. 1A, and will not be described here.

For example, in the example as shown in FIG. 1B, a first stage of shift register unit includes a first output terminal, a second output terminal, and a third output terminal which serve as a first output terminal OT<1>, a second output terminal OT<2>, and third output terminal OT<3> among the N+1 output terminals arranged in sequence, respectively, to output gate scan signals for driving a first row of sub-pixel units, a second row of sub-pixel units, and a third row of sub-pixel units through the first output terminal, the second output terminal, and the third output terminal, respectively. A second stage of shift register unit includes a first output terminal, a second output terminal and a third output terminal which serve as a fourth output terminal OT<4>, a fifth output terminal OT<5> and a sixth output terminal OT<6> among the N+1 output terminals arranged in sequence, respectively, to respectively output gate scan signals for driving a fourth row of sub-pixel units, a fifth row of sub-pixel units, a sixth row of sub-pixel units through the first output terminal, the second output terminal, and the third output terminal, and so on, and the structures of other stages of shift register units are similar to this structure, and will not be described here.

It should be noted that, an amount of output terminals included in each of shift register unit (that is, the number of rows of sub-pixel units which is driven) can also be 4, 5, 6, etc. The embodiments of the present disclosure are not limited to this case, but only need to adjust the timing of clock signals for controlling outputs of the output terminals according to the working principle of the shift register units.

For example, the gate scan signal for driving at least two rows of sub-pixel units, such as the gate scan signal for driving the (n)-th row of sub-pixel units, the gate scan signal for driving the (n+1)-th row of sub-pixel units, etc., can be output through the same shift register unit, thereby reducing an amount of transistors in the circuit structure, further reducing the size of the bezel of the display device by using the display panel 10, and improving the PPI of the display device.

Figure 2:
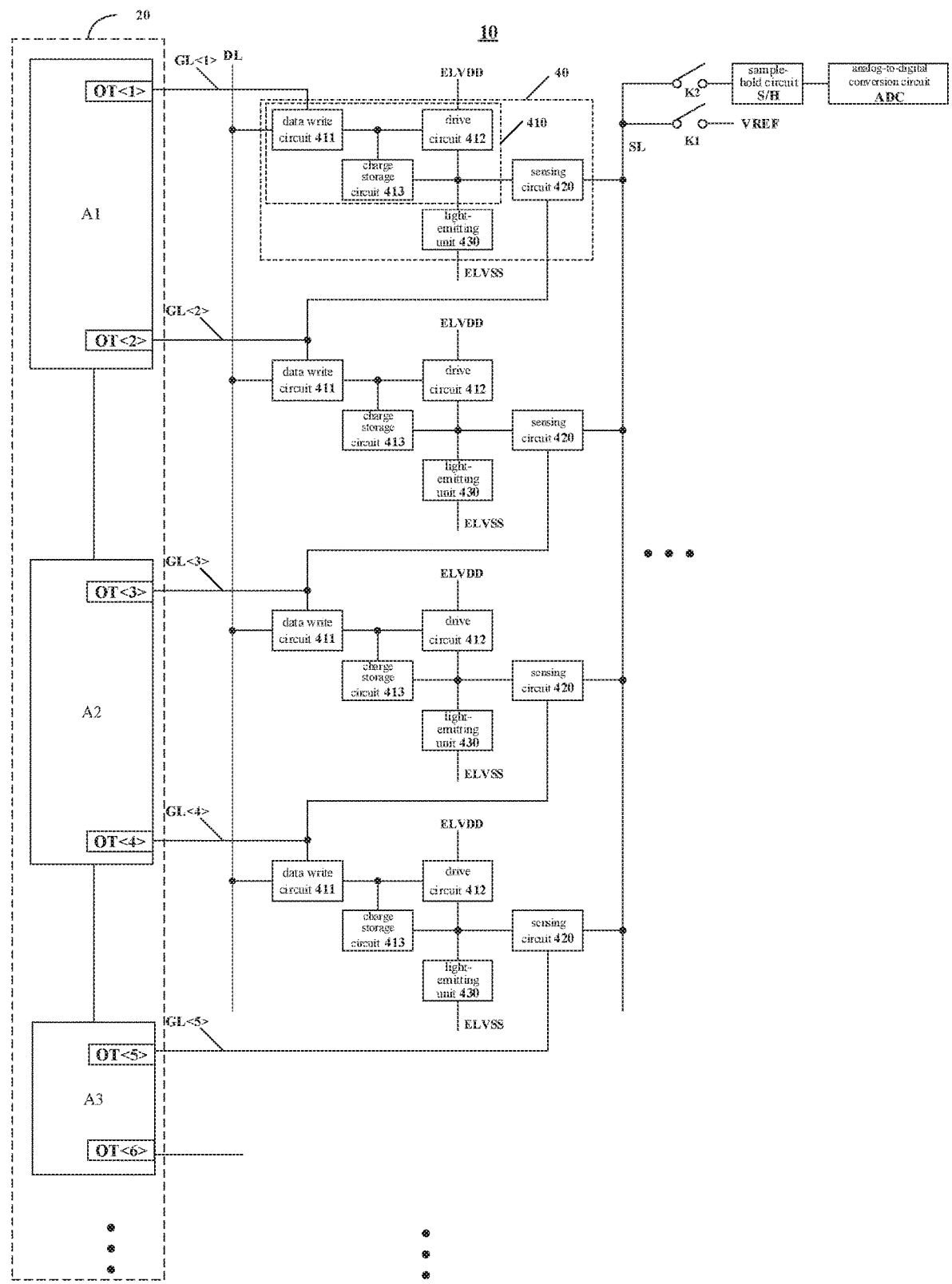
FIG. 2 is a schematic diagram of still another display panel provided by some embodiments of the present disclosure.

FIG. 2 is a schematic diagram of still another display panel provided by some embodiments of the present disclosure. As shown in FIG. 2, in some examples, the pixel drive circuit 410 includes a data write circuit 411 and a drive circuit 412. In other examples, the pixel drive circuit 410 further includes a charge storage circuit 413.

For example, in some examples, as shown in FIG. 2, the drive circuit 412 is connected to the data write circuit 411, a parasitic capacitance (not shown) or the charge storage circuit 413, the light-emitting unit 430, and the sensing circuit 420, and is configured to control a drive current for driving the light-emitting unit 430 to emit light. For example, in a light-emitting phase, the drive circuit 412 may supply a drive current to the light-emitting unit 430 so as to drive the light-emitting unit 430 to emit light, and the light-emitting unit 430 may emit light according to a desired "gray scale" (that is, a data signal).

As shown in FIG. 2, the data write circuit 411 is also connected to the parasitic capacitance (not shown) or the charge storage circuit 413, and is configured to receive a scan drive signal and write a data signal (DATA) to the drive circuit 412 in response to the scan drive signal. For example, taking the first row of sub-pixel units as an example, the data write circuit 411 is connected to the first output terminal OT<1> of the gate drive circuit 20 through a gate line GL<1> to receive the scan drive signal, and the data write circuit 411 can be turned on in response to the scan drive signal. For example, the data write circuits 411 in the first row of sub-pixel units may also be connected to data lines DL to receive data signals and write the data signals to the drive circuits 412 in the case where the data write circuit 411 is turned on. For example, at different phases, the data signals received by the data write circuits 411 may be compensated data signals used for driving the row of sub-pixel units to emit light, or may be data signals used for driving other row of sub-pixel units to emit light, and the embodiments of the present disclosure is not limited to this case.

As shown in FIG. 2, the sensing circuit 420 is also connected to the parasitic capacitance (not shown) or the charge storage circuit 413, and the light emitting unit 430, and is configured to, in response to the sensing drive signal, write a reference voltage signal (VREF) to the drive circuit 412, or read out the sensing voltage signal from the drive circuit 412. For example, taking the first row of sub-pixel units as an example, the sensing circuit 420 is connected to the second output terminal OT<2> of the gate drive circuit 20 through a gate line GL<2> to receive the sensing drive signal, and the sensing circuit 420 can be turned on in response to the sensing drive signal. For example, the sensing circuits 420 in the first row of sub-pixel units may also be connected to a sensing line SL. For example, in the case where the sensing circuit 420 is turned on, the sensing circuit 420 may write the reference voltage signal received through the sensing line SL into the drive circuit 412, or the sensing circuit 420 may output the sensing voltage signal read out from the drive circuit 412 through the sensing line SL.

For example, as shown in FIG. 2, the display panel 10 provided by the embodiments of the present disclosure may further include a sample-and-hold circuit S/H, an analog-to-digital conversion circuit ADC, a first switch K1, and a second switch K2. For example, when the reference voltage signal needs to be written through the sensing line SL, the first switch K1 is closed and the second switch K2 is opened. For another example, in the case where the sensing voltage signal needs to be read out through the sensing line SL, the first switch K1 is opened and the second switch K2 is closed.

For example, the sample-and-hold circuit S/H is configured to sample and hold the sensed voltage signal. The analog-to-digital conversion circuit ADC is connected to the sample-and-hold circuit S/H, and is configured to perform analog-to-digital conversion (converse an analog signal to a digital signal) on the sampled and held sensing voltage signal for subsequent further performing data processing. For example, the compensation information about a threshold voltage Vth and a current coefficient K in the drive circuit 412 can be obtained by processing the sensing voltage signal. For example, in the blanking phase of a certain frame, the sensing voltage signal can be obtained by the sensing circuit 420, and the compensation information about the threshold voltage Vth and the current coefficient K can be obtained by further performing data processing on the sensing voltage signal. Then, in the display phase of the next frame, the light-emitting unit 430 is driven again according to the compensation information obtained above, thereby completing the external compensation of the sub-pixel units 40. Specific compensation methods may refer to methods in the art and will not be described here.

For example, as shown in FIG. 2, the charge storage circuit 413 is also connected to the light-emitting unit 430, and is configured to store the written data signal and the reference voltage signal. For example, in the case where the data signal is written to the drive circuit 412 by the data write circuit 411, the charge storage circuit 413 may simultaneously store the data signal. For another example, in the case where the reference voltage signal is written to the drive circuit 412 by the sensing circuit 420, the charge storage circuit 413 may store the reference voltage signal at the same time.

In the display panel 10 provided by an embodiment of the present disclosure, as shown in FIG. 2, the display panel 10 further includes M data lines DL and M sensing lines SL. It should be noted that an amount of the data lines DL and an amount of the sensing lines SL included in the display panel 10 is respectively the same as the amount of the columns of the sub-pixel units 40 included in the display panel 10. Only one data line DL and one sensing line SL are exemplarily as shown in FIG. 2. Embodiments of the present disclosure include but are not limited to this case. The amount of data lines DL and the amount of sensing lines SL in the display panel 10 can be set as requirements.

For example, the data write circuits 411 in an (m)-th column of sub-pixel units is connected to an (m)-th data line DL to receive the data signal. The sensing circuits 420 in the (m)-th column of sub-pixel units is connected to an (m)-th sensing line SL to receive the reference voltage signal or output the sensing voltage signal; and 1≤m≤M.

In the display panel 10 provided by an embodiment of the present disclosure, as shown in FIG. 2, the display panel 10 further includes N+1 gate lines GL (GL<1>, GL<2>, GL<3>, GL<4>, GL<5>, etc.) arranged in sequence, and the N+1 gate lines are respectively connected to N+1 output terminals of the gate drive circuit 20 in one-to-one correspondence. For example, the data write circuits of a (2x−1)-th row of sub-pixel units are connected to the first output terminal of the (x)-th stage of shift register unit through a (2x−1)-th gate line. The sensing circuits of the (2x−1)-th row of sub-pixel units and the data write circuits of the (2x)-th row of sub-pixel units are connected to the second output terminal of the (x)-th stage of shift register unit through a (2x)-th gate line.

For example, in the case where the display panel 10 includes N rows of sub-pixel units, the gate drive circuit 20 includes N+1 output terminals (OT<1>, OT<2>, OT<3>, OT<4>, OT<5>, etc.), and a first gate line GL<1> is connected to the first output terminal of the first stage of shift register unit A1 of the gate drive circuit 20 which serves as the first output terminal OT<1>. A second gate line GL<2> is connected to the second output terminal of the first stage of shift register unit A1 of the gate drive circuit 20 which serves as the second output terminal OT<2>, and so on, the (N+1)-th gate line GL≤N+1> is connected to the output terminal of the last stage of shift register unit of the gate drive circuit 20 which serves as the (N+1)-th output terminal OT≤N+1>, that is, the N+1 gate lines are respectively connected to the N+1 output terminals of the gate drive circuit 20 in one-to-one correspondence.

Figure 3:
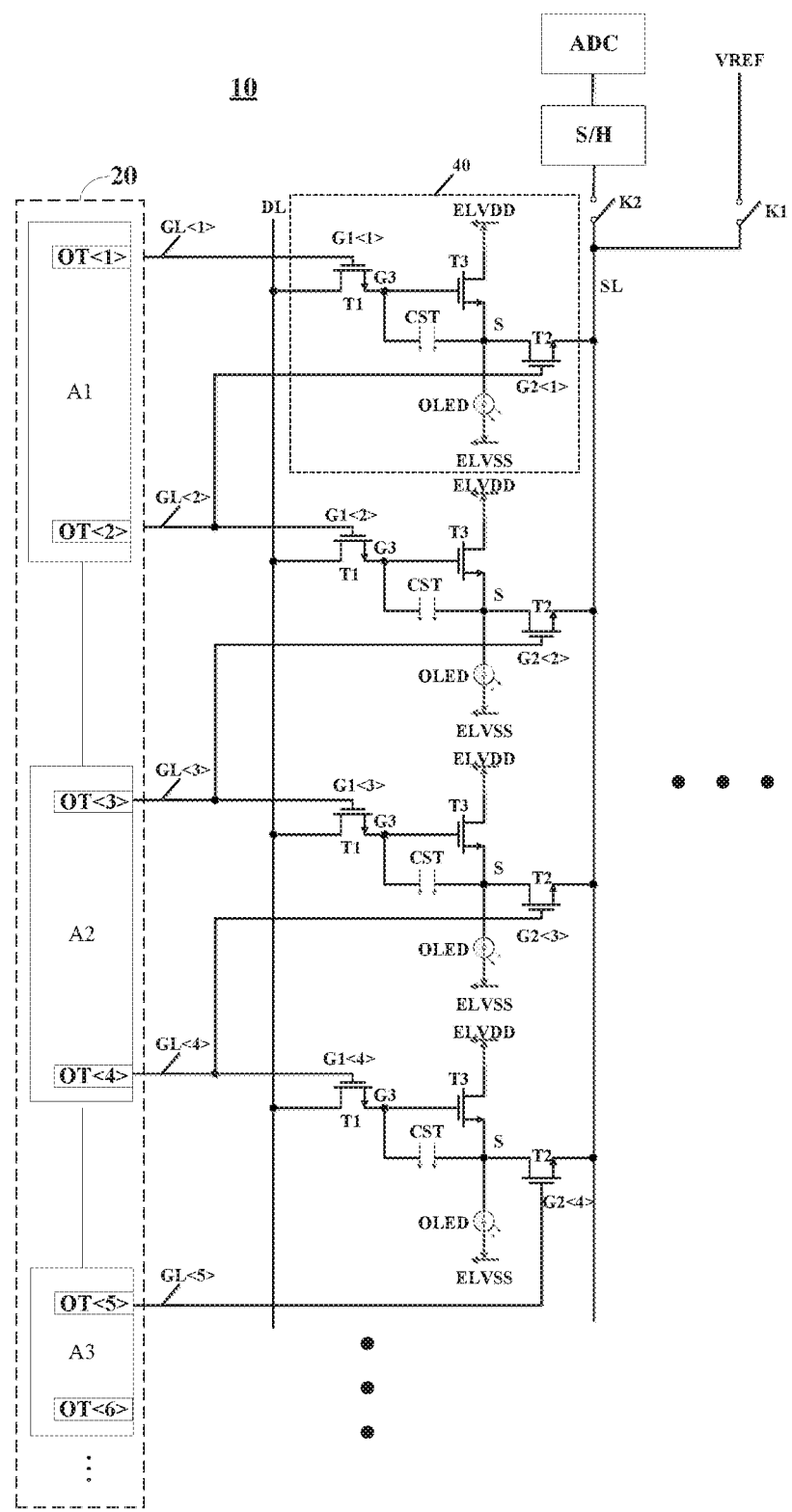
FIG. 3 is a circuit diagram of a display panel provided by some embodiments of the present disclosure.

FIG. 3 is a circuit diagram of a display panel provided by some embodiments of the present disclosure. As shown in FIG. 3, in the display panel 10 provided by some embodiments of the present disclosure, the plurality of sub-pixel units 40 may be implemented as the circuit structure as shown in FIG. 3.

For example, the data write circuit 411 may be implemented as a scan transistor T1, the drive circuit 412 may be implemented as a drive transistor T3, the sensing circuit 420 may be implemented as a sensing transistor T2, and the charge storage circuit 413 may be implemented as a storage capacitor CST. The transistors in the plurality of the plurality of sub-pixel units 40 will be described in detail below by taking the first row of sub-pixel units as an example. The structure of the other rows of sub-pixel units is similar to the structure of the first row of sub-pixel units and will not be described again.

A gate electrode of the scan transistor T1 is configured to receive the scan drive signal, for example, a gate electrode G1<1> of the scan transistor T1 is connected to the first gate line GL<1> of the N+1 gate lines (that is, the first gate line is connected to the first output terminal of the first stage of shift register unit) to receive the scan drive signal. A first electrode of the scan transistor T1 is configured to receive the data signal, for example, the first electrode of the scan transistor T1 is connected to one of the M data lines DL so as to receive the data signal. A second electrode of scan transistor T1 is connected to a gate electrode of drive transistor T3 (for example, a node G3).

A first electrode of the drive transistor T3 is configured to receive a first drive voltage ELVDD for generating a drive current, and a second electrode (S) of the drive transistor T3 is connected to a first electrode of the sensing transistor T2.

A gate electrode G2<1> of the sensing transistor T2 is configured to receive the sensing drive signal, for example, the gate electrode G2<1> of the sensing transistor T2 is connected to the second gate line GL<2> of the N+1 gate lines (that is, the second gate line is connected to the second output terminal of the first stage of shift register unit), so as to receive the sensing drive signal. A second electrode of the sensing transistor T2 is configured to receive the reference voltage signal or output the sensing voltage signal, for example, the second electrode of the sensing transistor T2 is connected to one of the M sensing lines SL so as to receive the reference voltage signal (VREF) or output the sensing voltage signal.

It should be noted that, because the sensing circuits in respective rows of sub-pixel units are turned on row by row, the second electrodes of the sensing transistors T2 of each row of sensing circuits can be connected to the same sensing line SL to respectively perform corresponding operations, in the case where the sensing transistors in respective rows of sub-pixel units are turned on row by row without affecting each other.

A first electrode of the storage capacitor CST is connected to the gate electrode (G3) of the drive transistor T3, and a second electrode of the storage capacitor CST is connected to the second electrode (S) of the drive transistor T3. The storage capacitor CST may be configured to maintain a voltage difference between the gate electrode (G3) of the drive transistor T3 and the second electrode (S) of the drive transistor T3.

For example, in the display panel 10 provided by some embodiments of the present disclosure, the light-emitting unit 430 may be implemented as an organic light-emitting diode (OLED) or a quantum dot light-emitting diode (QLED). In the following, OLED will be described as an example. For example, the OLED can be of various types, such as a top emission, a bottom emission, etc., and can emit red light, green light, blue light or white light, etc. The embodiments of the present disclosure are not limited to this case.

As shown in FIG. 3, a first electrode of the OLED is connected to a second electrode (S) of the drive transistor T3 so as to receive the drive current of the drive transistor T3. A second electrode of the OLED is configured to receive a second drive voltage ELVSS, for example, in some embodiments, the second electrode of the OLED is configured to be grounded, under this case, the second drive voltage ELVSS is 0V. For example, the first drive voltage ELVDD is a high level voltage (for example, 5V, 10V, or other suitable voltage), and the second drive voltage ELVSS is a low level voltage (for example, 0V, −5V, −10V or other suitable voltage). In the case where the drive transistor T3 is turned on (or partially turned on), the first drive voltage ELVDD and the second drive voltage ELVSS can be regarded as a power supply for generating the drive current for driving the OLED.

In the display panel 10 provided by some embodiments of the present disclosure, the sensing transistors T2 of the (n)-th row of sub-pixel units and the scan transistors T1 of the (n+1)-th row of sub-pixel units are both connected to the (n+1)-th output terminal of the gate drive circuit 20, so that the sensing transistors T2 of the (n)-th row of sub-pixel units and the scan transistors T1 of the (n+1)-th row of sub-pixel units can share the gate scan signal output by the (n+1)-th output terminal, so that the amount of output terminals of the gate drive circuit 20 can be reduced, the size of the bezel of the display device adopting the display panel 10 can be further reduced, and the PPI of the display device can be improved.

At the same time, the gate scan signal for driving at least two rows of sub-pixel units, such as the gate scan signal for driving the (n)-th row of sub-pixel units and the gate scan signal for driving the (n+1)-th row of sub-pixel units, can be output through the same shift register unit, so that the amount of transistors in a circuit structure can be reduced, the size of the bezel of the display device adopting the display panel 10 can be further reduced, and the PPI of the display device can be improved.

In addition, the external compensation can be realized by the sensing transistors T2 in the plurality of sub-pixel units 40. For example, in the blanking phase of a certain frame, the sensing voltage signal can be obtained by the sensing transistor T2, and compensation information about the threshold voltage Vth and the current coefficient K can be obtained by further performing data processing on the sensing voltage signal. Then, in the display phase of the next frame, the OLED is driven again according to the compensation information obtained above, thereby completing the external compensation of the plurality of sub-pixel units 40.

Figure 4:
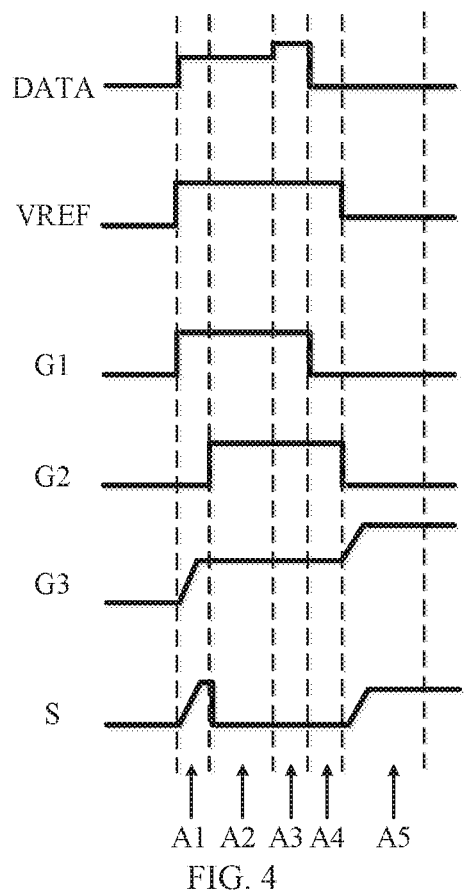
FIG. 4 is a signal timing diagram corresponding to an operation of the display panel as shown in FIG. 3 in a display phase of one frame.

FIG. 4 is a signal timing diagram corresponding to an operation of the display panel as shown in FIG. 3 in a display phase of one frame. In the following, the working principle of one of the plurality of sub-pixel units 40 in the display panel 10 as shown in FIG. 3 in the display phase of one frame will be explained with reference to the signal timing diagram as shown in FIG. 4, and here, the embodiments are described by taking the case that each transistor is an N-type transistor as an example, that is, each transistor is turned on at a high level and turned off at a low level, but the embodiments of the present disclosure is not limited thereto. The signal level in the signal timing diagram as shown in FIG. 4 is only schematic and does not represent the true level value.

In FIG. 4, DATA represents the data signal received by the plurality of sub-pixel units 40 through the data lines DL, VREF represents the reference voltage signal received by the plurality of sub-pixel units 40 through the sensing lines SL, G1 represents the gate electrode of the scan transistor T1 of one of the plurality of sub-pixel units 40, G2 represents the gate electrode of the sensing transistor T2, G3 represents the gate electrode of the drive transistor T3, S represents the second electrode of the drive transistor T3, and A1-A5 respectively represent a first phase to a fifth phase under the case where the first row of sub-pixel units 40 is working in the display phase.

As shown in FIG. 4, in the A1 phase, G1 is at a high level, and the scan transistor T1 is turned on. G2 is at a low level, and the sensing transistor T2 is turned off. At this phase, because the data signal of another row other than the current row is written through the data line DL, the potential of G3 becomes a high level. Due to the bootstrap effect of the storage capacitor CST, the potential of S also becomes a high level at this phase.

In the A2 phase, the potential of G2 changes from a low level to a high level, and the sensing transistor T2 is turned on while the scan transistor T1 remains to be turned on. At this phase, the data signal of another row other than the current row is written. For example, the data signal written in the A2 phase and the data signal written in the A1 phase may be the same or different. The reference voltage signal VREF is written through the sensing line SL, for example, the reference voltage signal VREF is a low level signal (for example, the low level is 0V).

In the A3 phase (a data write phase), G1 and G2 remain at a high level, so that the scan transistor T1 and the sensing transistor T2 remain to be turned on. At this phase, the data signal of the current row is written through the data line DL, for example, the data signal is an externally compensated data signal for driving the current row of sub-pixel units to emit light. The reference voltage signal VREF is written through the sensing line SL. For example, the reference voltage signal VREF may be the same as the reference voltage signal VREF written in the A2 phase.

In the A4 phase (a holding phase), the potential of G1 changes from a high level to a low level, and the scan transistor T1 is turned off, G2 continues to maintain a high level, and the sensing transistor T2 continues to be turned on. At this phase, the storage capacitor CST maintains the potential of G3 and the potential of S unchanged.

In the A5 phase (a light-emitting phase), G1 remains at a low level, and the scan transistor T1 is turned off. The potential of G2 changes from a high level to a low level, and the sensing transistor T2 is turned off. At this phase, the drive transistor T3 is turned on under the combined effect of the potential of G3 and the potential of S (for example, the absolute value of the potential difference between the potential of G3 and the potential of S is greater than the threshold voltage Vth of the drive transistor T3), and the first drive voltage ELVDD charges the second electrode S of the drive transistor T3, that is, drives the OLED to emit light. At the same time, in the case where the potential of S is increased, the potential of G3 also is increased due to the bootstrap effect of storage capacitor CST.

Thus, the light-emitting units 430 (for example, an OLED) in the plurality of sub-pixel units 40 can complete light emission through the above five phases. It should be noted that, as shown in FIG. 4, in this example, the plurality of sub-pixel units 40 write the data signal of the current row only in the last quarter of the phase where G1 is at a high level (the A1 phase, the A2 phase, and the A3 phase). In addition, the time period when the potential of G1 (or G2) is a high level is the pulse width of the gate scan signal output by the gate drive circuit 20, and the level of G1 (or G2) is the level of the gate scan signal output by the gate drive circuit 20.

Figure 5:
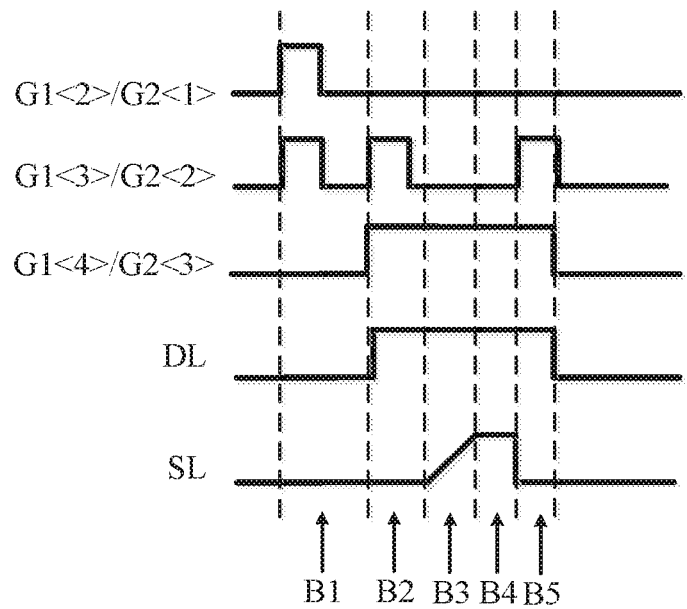
FIG. 5 is a signal timing diagram corresponding to an operation of the display panel as shown in FIG. 3 in a blanking phase of one frame.

FIG. 5 is a signal timing diagram corresponding to an operation of the display panel as shown in FIG. 3 in a blanking phase of one frame. The working principle of the display panel 10 as shown in FIG. 3 in the blanking phase of one frame will be described below with reference to the signal timing diagram as shown in FIG. 5, and the embodiments are described by taking the case that each transistor is an N-type transistor as an example, but the embodiments of the present disclosure are not limited thereto. The signal level in the signal timing diagram shown in FIG. 5 is only schematic and does not represent the true level value. For example, in the blanking phase of the frame, the third row of sub-pixel units are selected for sensing. The sensing principle of the other rows of sub-pixel units is similar to the sensing principle of the third row of sub-pixel units and will not be described again.

In FIG. 5, G1<2>/G2<1> represents the gate electrode of the scan transistor T1 in the second row of sub-pixel units (or the gate electrode of the sensing transistor T2 in the first row of sub-pixel units), G1<3>/G2<2> represents the gate electrode of the scan transistor T1 in the third row of sub-pixel units (or the gate electrode of the sensing transistor T2 in the second row of sub-pixel units), and G1<4>/G2<3> represents the gate electrode of the scan transistor T1 (or the gate electrode of the sensing transistor T2 in the third row of sub-pixel units). DL represents a signal provided by a data line, SL represents a signal provided (or read) by a sensing line, and B1-B5 respectively represent a first phase to a fifth phase when the third row of sub-pixel units 40 is working in the blanking phase.

In the case where the third row of sub-pixel units is sensing, at first, it is necessary to enable the potential of the gate electrode G1<3> of the scan transistors T1 in the third row of sub-pixel units and the potential of the gate electrode G2<3> of the sensing transistors T2 to be at a high level. At the same time, because the gate electrode G2<2> of the sensing transistors T2 in the second row of sub-pixel units and the gate electrode G1<3> of the scan transistors T1 in the third row of sub-pixel units are connected, the sensing transistors T2 in the second row of sub-pixel units will turn on at this time, thus causing a sensing error. Because the second row of sub-pixel units are originally in the light-emitting phase, a current flows through the drive transistors T3 in the second row of sub-pixel units, thereby charging the second electrodes S of the drive transistors T3. At this time, the sensing line SL also senses the second row of sub-pixel units in the case where the third row of sub-pixel units are sensing, thus causing the above sensing error.

In order to avoid the above sensing error, in the case where the third row of sub-pixel units are sensing, the drive transistors T3 in the second row of sub-pixel units need to be turned off at first.

In the B1 phase (a reset phase), the drive transistors T3 in the second row of sub-pixel units is turned off. For example, at this stage, the potential of G1<2> and the potential of G2<2> are both at a high level, so that the scan transistors T1 and the sensing transistors T2 in the second row of sub-pixel units are turned on, a correction potential is written to the gate electrodes (G3) of the drive transistors T3 through the data lines DL and the scan transistors T1, and a correction potential is also written to the second electrodes (S) of the drive transistors T3 through the sensing lines SL and the sensing transistors T2. For example, the correction potential is 0V, thereby turning off the drive transistors T3 in the second row of sub-pixel units.

In the B2 phase (a resetting phase), the potential of G1<3> and the potential G2<3> are both at a high level, so that the scan transistors T1 and the sensing transistors T2 in the third row of sub-pixel units are turned on, and a data signal (for example, a high level signal, for example, 3.5V) is written to the gate electrodes (G3) of the drive transistors T3 through the data lines DL and the scan transistors T1. And a reference voltage signal (for example, a low level signal, for example, 0V) is written to the second electrodes (S) of the drive transistors T3 through the sensing lines SL and the sensing transistors T2, so that the drive transistors T3 in the third row of sub-pixel units is turned on. It should be noted that in B2 phase, the written data signal and the reference voltage signal may be constant values, for example, 3.5V and 0V, respectively.

In the B3 phase (a charging phase), the potential of G1<3> changes from a high level to a low level, so that the scan transistors T1 in the third row of sub-pixel units is turned off. The potential of G2<3> continues to maintain a high level, so that the sensing transistor T2 in the third row of sub-pixel units remains to be turned on. The drive transistors T3 in the third row of sub-pixel units continues to be turned on, so that the first drive voltage ELVDD charges the second electrodes (S) of the drive transistors T3. For example, at this stage, the sensing lines SL may remain suspended.

In a B3 phase, the potential of the second electrodes (S) of the drive transistors T3 remains basically unchanged after charging for a time period, and then in the B4 phase (a sensing phase), the potential of the second electrode (S) of the drive transistor T3, that is, the sensing voltage signal, can be sensed through the sensing lines SL, that is, the sensing voltage signal is output through the sensing line SL.

In the B5 phase (a data write phase), the potential of G1<3> and the potential of G2<3> are both at a high level, so that the scan transistor T1 and the sensing transistor T2 in the third row of sub-pixel units are turned on, the data signal is written to the gate electrode (G3) of the drive transistor T3 through the data line DL and the scan transistor T1, and the reference voltage signal (for example, a low level signal, for example, 0V) is written to the second electrode (S) of the drive transistor T3 through the sensing line SL and the sensing transistor T2, thereby turning on the drive transistor T3 in the third row of sub-pixel units. For example, the data signal written in the B5 phase may be the same as the data signal used in the data write phase (A3) in the display phase.

Some embodiments of the present disclosure also provide a drive method that can be used to drive the display panel 10 provided by any one of the embodiments of the present disclosure. The drive method includes a display phase for one frame and a blanking phase for one frame.

In the display phase, in each sub-pixel units 40, the pixel drive circuit 410 is caused to drive the light-emitting unit 430 to emit light, and during in the blanking phase, an (i)-th row of sub-pixel units is randomly selected from the N rows of sub-pixel units, thereby performing sensing on the sensing circuits in the (i)-th row of sub-pixel units. Here, N is an integer greater than or equal to 2, and $1 \leq i \leq N$.

For example, in the drive method provided by some embodiments of the present disclosure, the display phase includes a data write phase, a holding phase, and a light-emitting phase.

In the case where the pixel drive circuit 410 includes the data write circuit 411, the drive circuit 412, and the charge storage circuit 413.

In the data write phase, the data write circuit 411 and the sensing circuit 420 are turned on, and a data signal and a reference voltage signal are respectively written through the data writing circuit 411 and the sensing circuit 420;

In the holding phase, the data write circuit 411 is turned off, and the sensing circuit 420 is turned on, so that the charge storage circuit 413 stores the data signal and the reference voltage signal; and In the light-emitting phase, the data write circuit 411 and the sensing circuit 420 are turned off, so that the drive circuit 412 is turned on, and the drive circuit 412 drives the light-emitting unit 430 to emit light according to the data signal.

It should be noted that the detailed description of the above-mentioned data write phase, the holding phase, and the light-emitting phase can refer to the above-mentioned description of the A3 phase, the A4 phase, and the A5 phase respectively.

For example, in the drive method provided by some embodiments of the present disclosure, the blanking phase includes a reset phase, a resetting phase, a charging phase, and a sensing phase. In the case where the pixel drive circuit 410 includes a data write circuit 411, a drive circuit 412, and a charge storage circuit 413, in the case of performing sensing on the (i)-th row sub-pixel units:

in the reset phase, the drive circuits 412 in the (i)-th row of sub-pixel units are turned off;

in the resetting phase, the data write circuits 411 and the sensing circuits 420 in the (i)-th row of sub-pixel units are turned on, and a data signal and a reference voltage signal are respectively written through the data write circuits 411 and the sensing circuits 420 to turn on the drive circuits 412 in the (i)-th row of sub-pixel units;

in the charging phase, the data write circuits 411 in the (i)-th row of sub-pixel units are turned off, the sensing circuits 420 in the (i)-th row of sub-pixel units are turned on, and the sensing circuits 420 are charged by the drive circuits 412; and in the sensing phase, the data write circuits 411 in the (i)-th row of sub-pixel units are turned off, the sensing circuits 420 in the (i)-th row of sub-pixel units are turned on, and a sensing voltage signal is output through the sensing circuits 420.

For example, in the drive method provided by some embodiments of the present disclosure, in the reset phase, the data write circuits 411 and the sensing circuits 420 in the (i)-th row of sub-pixel units are turned on, and a correction voltage is written through the data write circuits 411 and the sensing circuits 420, respectively, so that the drive circuits 412 in the (i)-th row of sub-pixel units are turned off.

It should be noted that the detailed description of the reset phase, the resetting phase, the charging phase, and the sensing phase can refer to the description of the B1 phase, the B2 phase, the B3 phase and the B4 phase respectively.

In addition, the technical effect of the drive method provided by the embodiment of the present disclosure can be referred to the corresponding description in the embodiments of the display panel 10 described above, which is not repeated here.

The gate drive circuit 20 in the display panel 10 provided by some embodiments of the present disclosure will be described in detail below. For example, the gate drive circuit 20 in the display panel 10 as shown in FIG. 1A is described as an example, and the following embodiments are the same as the above and will not be described again. The gate drive circuit 20 can be used in a display device to provide a gate scan signal during the display process of one frame of a display device.

Figure 6:
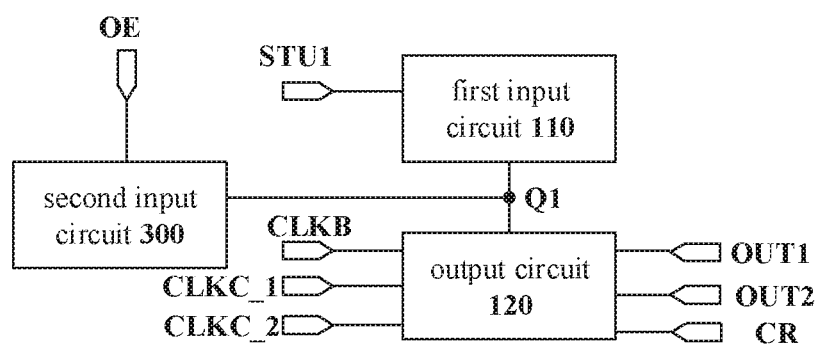
FIG. 6 is a schematic diagram of a shift register unit provided by some embodiments of the present disclosure.

For example, the gate drive circuit 20 includes a plurality of cascaded shift register units. FIG. 6 is a schematic diagram of a shift register unit provided by some embodiments of the present disclosure. As shown in FIG. 6, the shift register unit 21 includes a first input circuit 110, a second input circuit 300, and an output circuit 120.

For example, the first input circuit 110 is connected to a first node Q1, and is configured to, in response to a first input signal STU1, control the level of the first node Q1 for example, to charge the first node Q1. For example, the first input circuit 110 may also be configured to receive the first input signal STU1 and a first voltage VDD, and the first input circuit 110 is turned on in response to the first input signal STU1, so that the first node Q1 may be charged with the first voltage VDD.

For example, in some examples, the output circuit 120 includes a first output terminal OUT1 and a second output terminal OUT2 which are connected to the first node Q1 and is configured to, under control of the level of the first node Q1, output a first output signal as a gate scan signal at the first output terminal OUT1, and output a second output signal as a gate scan signal at the second output terminal OUT2. For example, the output circuit 120 may also be connected to a first clock signal terminal CLKC_1 and a second clock signal terminal CLKC_2 to receive a first clock signal and a second clock signal, respectively, and is configured to, under the case of being turned on under control of the level of the first node Q1, enable the first output terminal to be connected to the first clock signal terminal CLKC_1 to output the first clock signal as the first output signal, and enable the second output terminal to be connected to the second clock signal terminal CLKC_2 to output the second clock signal as the second output signal.

For example, in other examples, the output circuit 120 may further include a shift output terminal CR, and is configured to output a shift signal to a shift register unit cascaded with the (x)-th stage of shift register unit. For example, the output circuit 120 may be connected to a third clock signal terminal CLKB, so as to under the case of being turned on under control of the level of the first node Q1, connect the shift output terminal CR with the third clock signal terminal CLKB to output a third clock signal CLKB as the shift signal CR.

For example, in the display phase of one frame, the shift signal CR output by the output circuit 120 may be supplied to other shift register units 21 as the first input signal STU1, thereby completing the row by row shift of the display scanning. The first output signal OUT1 and the second output signal OUT1 output by the output circuit 120 can drive a certain adjacent two rows of sub-pixel units in the display panel 10 row by row for display scanning or sensing scanning. For example, the first output terminal OUT1 outputs a gate scan signal of the (N)-th row, and the second output signal terminal OUT2 outputs a gate scan signal of the (N+1)-th row. For another example, in the blanking phase of one frame, the first output signal OUT1 output by the output circuit 120 may be used to drive the sensing transistors in a certain row of sub-pixel units in the display panel 10 to complete external compensation of the row of sub-pixel units.

It should be noted that in the display phase of one frame, the signal waveform of the shift signal CR output by the output circuit 120 and the signal waveform of the first output signal OUT1 may be the same or different, and the embodiments of the present disclosure is not limited to this case.

For example, in the gate drive circuit, some shift register units 21 may be connected to a clock signal line to receive the first input signal STU1 provided by the clock signal line. Alternatively, some shift register units 21 may also receive the shift signal CR output by the other stages of shift register units 21 as the first input signal STU1.

It should be noted that in some embodiments of the present disclosure, the first voltage VDD is, for example, at a high level, and the following embodiments are the same and will not be described again.

In addition, it should be noted that in some embodiments of the present disclosure, the high level and the low level are relative. The high level indicates a higher voltage range (for example, the high level may adopt 5V, 10V, or other suitable voltages), and multiple high levels may be the same or different. Similarly, a low level indicates a lower voltage range (for example, a low level may adopt 0V, −5V, −10V, or other suitable voltages), and a plurality of low levels may be the same or different. For example, the minimum value of the high level is larger than the maximum value of the low level.

It should be noted that in some embodiments of the present disclosure, controlling the level of a node (for example, the first node Q1, etc.) includes charging the node to pull up the level of the node or discharging the node to pull down the level of the node. For example, a capacitor electrically connected to the node can be set, and charging the node means charging the capacitor electrically connected to the node. Similarly, discharging the node means discharging the capacitor electrically connected to the node. The high level or low level of the node can be maintained through the capacitor.

It should be noted that in the present disclosure, OUT1 represents both the first output terminal and the first output signal, OUT2 represents both the second output terminal and the second output signal, CLKC_1 represents both the first clock signal terminal and the first clock signal, CLKC_2 represents both the second clock signal terminal and the second clock signal, CLKB represents both the third clock signal terminal and the third clock signal. The following embodiments are the same as the above description and will not be described again.

It should be noted that FIG. 6 is only one example of the present disclosure, for example, which is some examples of the shift register unit as shown in FIG. 1A. The embodiments of the present disclosure do not limit the amount of sub-pixel units included in the shift register unit 21, for example, the shift register unit 21 may also include three, four or more circuits, and the amount of circuits may be set according to actual conditions.

As shown in FIG. 6, the shift register unit 21 further includes a second input circuit 300. The second input circuit 300 is connected to the first node Q1 and is configured to receive a selection control signal OE and control the level of the first node Q1, for example, to charge the first node Q1 in the blanking phase.

For example, in the blanking phase of one frame, the second input circuit 300 may charge the first node Q1, so that, under control of the level of the first node Q1, the output circuit 120 outputs the first output signal OUT1, the second output signal OUT2, or the shift signal CR. In this phase, the first output signal OUT1 or the second output signal OUT2 can be used to drive the sensing transistors in a certain row of sub-pixel units in the display panel 10 to complete external compensation of the row of sub-pixel units.

Figure 7:
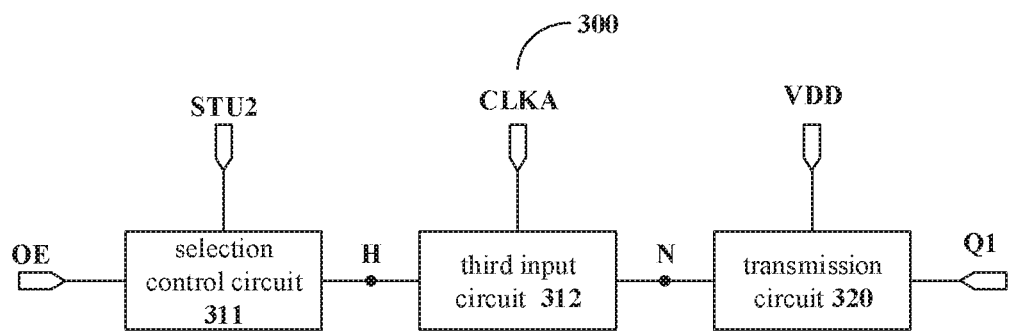
FIG. 7 is a schematic diagram of a second input circuit provided by some embodiments of the present disclosure.

As shown in FIG. 7, in some embodiments of the present disclosure, the second input circuit 300 includes a selection control circuit 311, a third input circuit 312, and a transmission circuit 320.

The selection control circuit 311 is connected to a third node H, and is configured to, in response to the selection control signal OE, control the level of the third node H with the second input signal STU2, for example, to charge the third node H and maintain the level of the third node H. For example, in the display phase of one frame, the selection control circuit 311 may be turned on under control of the selection control signal OE, thereby charging the third node H with the second input signal STU2. For example, the level (for, a high level) of the third node H may be maintained from the display phase of one frame to the blanking phase of that frame.

For example, in the case where the gate drive circuit 20 includes a plurality of cascaded shift register units 21, one stage of shift register unit 21 may receive the shift signal CR output by other stage of shift register unit 21 as the second input signal STU2. For example, in the case where it is necessary to select a certain stage of shift register unit 21 to output a drive signal in the blanking phase of one frame, the waveform timing of the selection control signal OE and the waveform timing of the second input signal STU2 supplied to the stage of cascaded shift register unit 21 can be the same, thereby enabling the selection control circuit 311 in the stage of shift register unit 21 to be turned on.

The third input circuit 312 is connected to the third node H and the fourth node N, and is configured to control the level of the fourth node N under control of the level of the third node H. For example, the third input circuit 312 is connected to the fourth clock signal terminal to receive the fourth clock signal CLKA, so that, under the case of being turned on under control of the level of the third node H, the fourth clock signal CLKA can be transmitted to the fourth node N, thereby controlling the level of the fourth node N. For example, in the blanking phase of one frame, in the case where the fourth clock signal CLKA is at a high level, the third input circuit 312 may transmit the high level to the fourth node N, thereby causing the potential of the fourth node N to become at a high level.

Figures 9A, 9B:
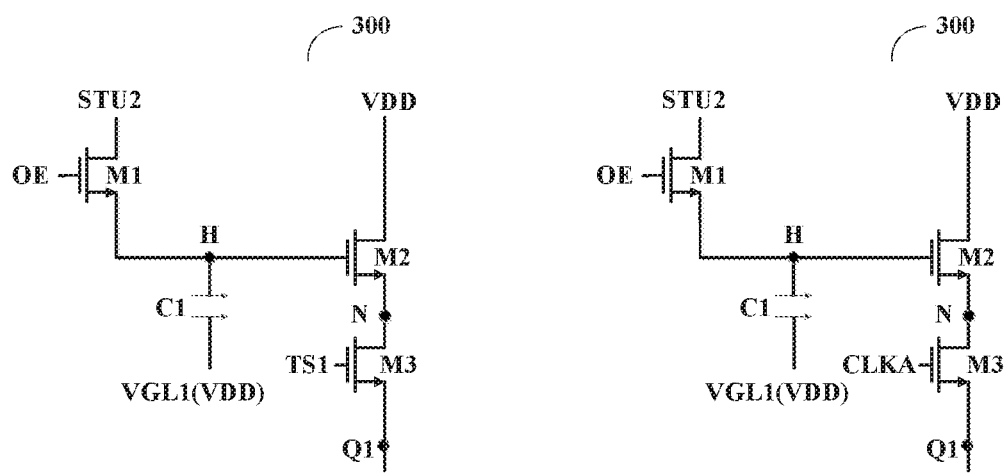
FIG. 9A to FIG. 9F are circuit diagrams of six examples of a second input circuit provided by some embodiments of the present disclosure.

The transmission circuit 320 is electrically connected to the first node Q1 and the fourth node N, and is configured to control the level of the first node Q1 under control of the level of the fourth node N or a first transmission signal TS1 (as shown in FIG. 9A), for example, to charge the first node Q1. For example, in some examples, the transmission circuit 320 may receive a first voltage VDD at a high level, and under the case where the transmission circuit 320 is turned on under control of the level of the fourth node N, the first node Q1 may be charged with the first voltage VDD. For another example, in other examples, the transmission circuit 320 may also be turned on under control of the first transmission signal TS1, thereby realizing the electrical connection between the fourth node N and the first node Q1, and further charging the first node Q1 with the third input circuit 312.

It should be noted that in the embodiments of the present disclosure, the first transmission signal TS1 may adopt the fourth clock signal CLKA, thus saving the clock signal line.

It should be noted that in the embodiments of the present disclosure, the second input circuit 300 is provided in the shift register unit 21 in order to realize that the drive signal can be output in the blanking phase of one frame, and it is not limited that the second input circuit 300 only works in the blanking phase. The following embodiments are the same as the above and will not be described again.

As shown in FIG. 8 and FIG. 9A-FIG. 9F, in some embodiments, the selection control circuit 311 may be implemented to include a first transistor M1 and a first capacitor C1. A gate electrode of the first transistor M1 is configured to receive the selection control signal OE, a first electrode of the first transistor M1 is configured to receive the second input signal STU2, and a second electrode of the first transistor M1 is connected to the third node H. For example, in the case where the selection control signal OE is a turn-on signal at a high level, the first transistor M1 is turned on, so that the third node H can be charged with the second input signal STU2.

A first electrode of the first capacitor C1 is connected to the third node H, and a second electrode of the first capacitor C1 is configured to receive a fourth voltage VGL1 or the first voltage VDD. The potential of the third node H can be maintained by setting the first capacitor C1. For example, in the display phase of one frame, the selection control circuit 311 charges the third node H to pull up the third node H to a high potential, and the first capacitor C1 can maintain the high potential of the third node H to the blanking phase of the frame. In addition, in some other embodiments, the second electrode of the first capacitor C1 may also be connected to the fourth node N.

It should be noted that in the embodiments of the present disclosure, the fourth voltage VGL1 is, for example, at a low level, and the following embodiments are the same and will not be described again.

Figure 8:
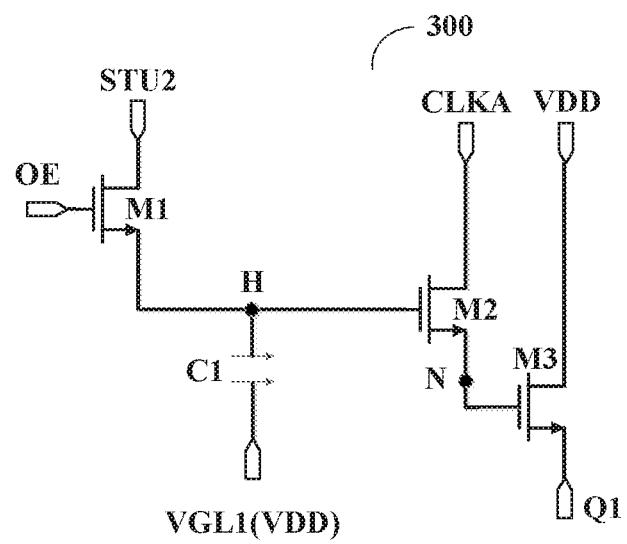
FIG. 8 is a circuit diagram of a second input circuit provided by some embodiments of the present disclosure.

For example, in the embodiment shown in FIG. 8, the third input circuit 312 may be implemented as the second transistor M2. A gate electrode of the second transistor M2 is connected to the third node H, a first electrode of the second transistor M2 is configured to receive a fourth clock signal CLKA, and a second electrode of the second transistor M2 is connected to the fourth node N. For example, under the case where the third node H is at a high level, the second transistor M2 is turned on, so that the fourth clock signal CLKA can be transmitted to the fourth node N to pull up the level of the fourth node N.

For example, in the embodiment as shown in FIG. 8, the transmission circuit 320 includes a third transistor M3.

A gate electrode of the third transistor M3 is connected to the fourth node N, a first electrode of the third transistor M3 is configured to receive the first voltage VDD, and a second electrode of the third transistor M3 is connected to the first node Q1. For example, under the case where the fourth node N is at a high level, the third transistor M3 is turned on, so that the first node Q1 can be charged with the first voltage VDD at a high level.

The second input circuit 300 provided in FIG. 9A-FIG. 9F will be described below. It should be noted that in the following description, the same parts of FIG. 9A-FIG. 9F and FIG. 8 will not be described again.

For example, in the second input circuit 300 provided in FIG. 9A, the first electrode of the second transistor M2 is configured to receive the first voltage VDD. The gate electrode of the third transistor M3 is configured to receive the first transmission signal TS1, and the first electrode of the third transistor M3 and the fourth node N are connected. For example, in the blanking phase of one frame, in the case where it is necessary to charge the first node Q1, the first transmission signal TS1 may be set at a high level, thereby turning on the third transistor M3, and the first voltage VDD at a high level may charge the first node Q1 through the second transistor M2 and the third transistor M3.

For example, in the second input circuit 300 provided in FIG. 9B, the gate electrode of the third transistor M3 may be connected to the fourth clock signal terminal CLKA to receive the fourth clock signal CLKA. For example, in the blanking phase of one frame, in the case where the fourth clock signal CLKA is at a high level, the third transistor M3 is turned on, and the first voltage VDD at a high level can charge the first node Q1.

Figure 9C:
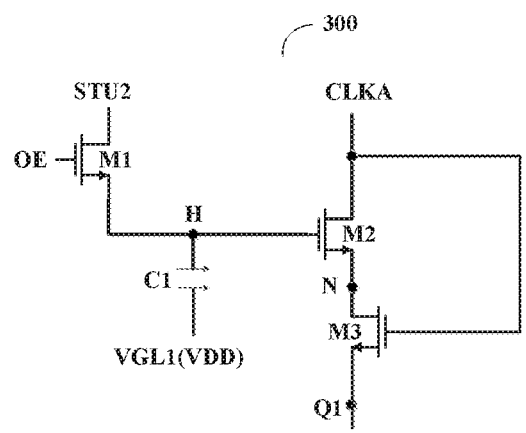

For example, as shown in FIG. 9C, the second input circuit 300 provided in FIG. 9C differs from FIG. 9B in that the first electrode of the second transistor M2 is configured to receive the fourth clock signal CLKA. Compared with the first electrode of the second transistor M2 in FIG. 9B which receives the first voltage VDD at high level all the time, the second transistor M2 in FIG. 9C can reduce the time when the high level is applied to the first electrode of the second transistor M2, thereby prolonging the service life of the second transistor M2 and ensuring the stability of the shift register unit 21.

Figure 9D:
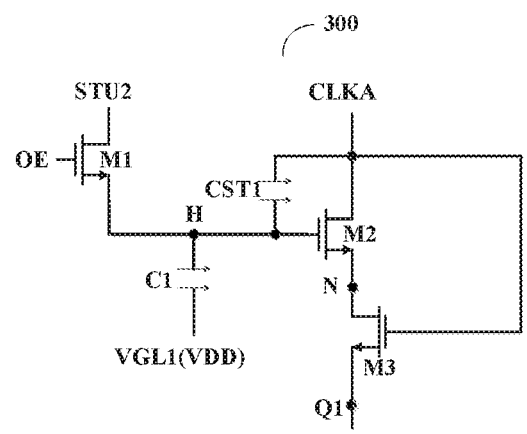

For example, as shown in FIG. 9D, compared to FIG. 9C the second input circuit 300 further includes a first coupling capacitance CST1. A first electrode of the first coupling capacitor CST1 is configured to receive the fourth clock signal CLKA, and a second electrode of the first coupling capacitor CST1 is connected to the third node H. For example, in the case where the fourth clock signal CLKA changes from a low level to a high level, the fourth clock signal CLKA can couple and pull up the third node H through the coupling effect of the first coupling capacitor CST1, so that the level of the third node H is further pulled up, thereby ensuring more sufficient conduction of the second transistor M2.

Figure 9E:
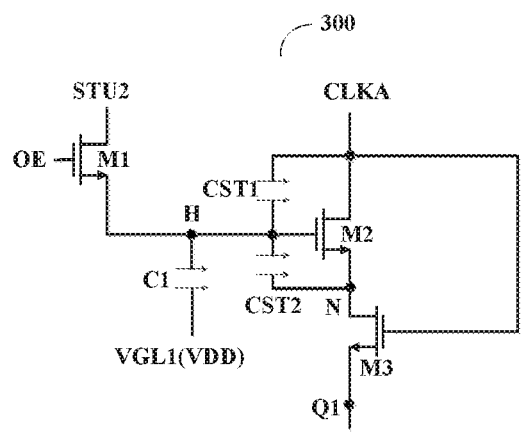

For example, as shown in FIG. 9E, compared to FIG. 9D, the second input circuit 300 further includes a second coupling capacitance CST2, a first electrode of the second coupling capacitance CST2 and the third node H are connected, and a second electrode of the second coupling capacitance CST2 and the fourth node N are connected. For example, in the case where the fourth clock signal CLKA changes from a low level to a high level, if the second transistor M2 is turned on at this time, the fourth clock signal CLKA at a high level can be transmitted to the fourth node N through the second transistor M2, so that the potential of the second electrode of the second coupling capacitor CST2 is pulled high, and the level of the third node H can be further pulled high through bootstrap effect, thus ensuring that the second transistor M2 is turned on more fully.

Figure 9F:
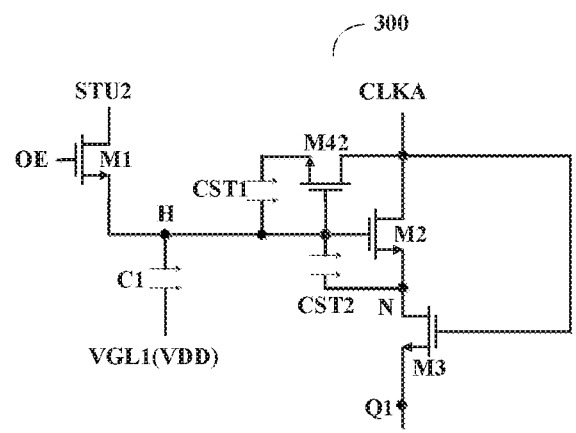

For example, as shown in FIG. 9F, the second input circuit 300 further includes a forty-second transistor M42, compared to FIG. 9E, a gate electrode of the forty-second transistor M42 is connected to the third node H, a first electrode of the forty-second transistor M42 is configured to receive the fourth clock signal CLKA, and a second electrode of the forty-second transistor M42 is connected to the first electrode of the first coupling capacitor CST1. For example, in the case where the third node H is at a high level, the forty-second transistor M42 is turned on, and the fourth clock signal CLKA can couple and pull up the third node H through the coupling effect of the first coupling capacitor CST1, so that the level of the third node H is further pulled up, thereby ensuring that the second transistor M2 is turned on more fully.

Figure 10:
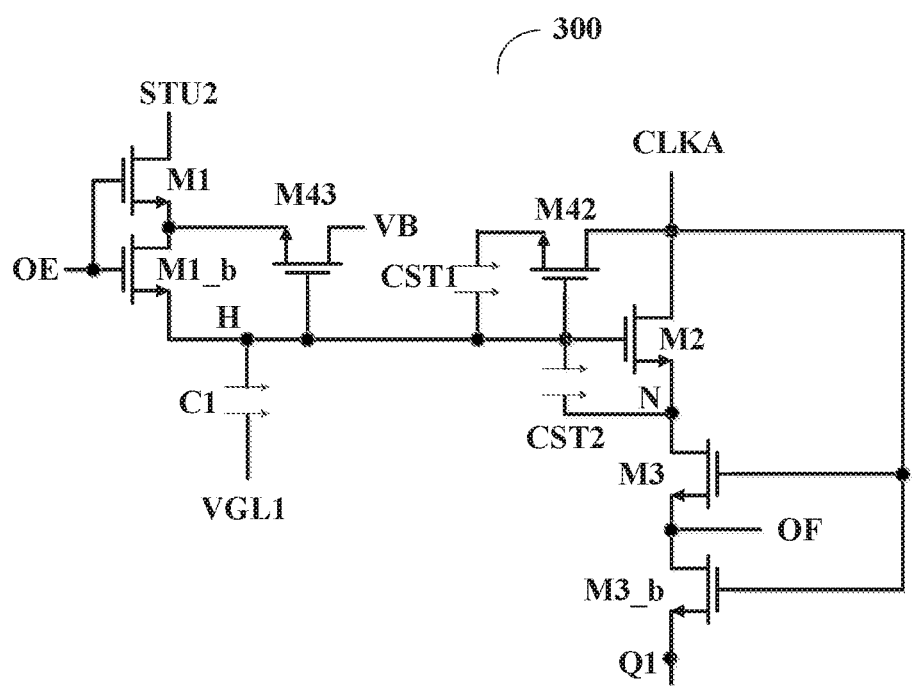
FIG. 10 is a circuit diagram of a second input circuit with an anti-leakage structure provided by some embodiments of the present disclosure.

For example, FIG. 10 also provides a second input circuit 300, compared to FIG. 9E, in order to prevent electric leakage at the third node H, the second input circuit 300 further includes a forty-third transistor M43, a transistor M1_b and a transistor M3_b.

As shown in FIG. 10, a gate electrode of the forty-third transistor M43 is connected to the third node H, and a first electrode of M43 is configured to receive a sixth voltage VB, and a second electrode of M43 is connected to the second electrode of the first transistor M1. A gate electrode of transistor M1_b is configured to receive the selection control signal OE, a first electrode of M1_b is connected to the second electrode of first transistor M1, and a second electrode of M1_b is connected to the third node H. A gate electrode o the transistor M3_b and a gate electrode of the transistor M4_b are configured to receive the fourth clock signal CLKA, a first electrode of the transistor M3_b is connected to a seventh node OF, and a second electrode of the transistor M3_b is connected to the first node Q1.

The combination of the forty-third transistor M43 and the transistor M1_b can prevent the third node H from leaking electricity, the transistor M3_b can prevent the first node Q1 from leaking electricity, and the transistor M4_b can prevent the second node Q2 from leaking electricity.

In the case where the potential of the first node Q1 or the potential of the third node H is maintained at a high level, the first electrode of some transistors (for example, the first transistor M1, a fourteenth transistor M14, a thirty-eighth transistor M38, the fortieth transistor M40, etc.) are connected to the first node Q1, the second node Q2, or the third node H, while the second electrode is connected to a low level signal. Even under the case where non-turn-on signal are input to the gate electrodes of these transistors, electric leakage may occur due to a voltage difference between the first electrodes and the second electrodes thereof, thereby deteriorating the effect of maintaining the potential of the first node Q1, the second node Q2, or the third node H in the shift register unit 21. The operation principle of electric leakage prevention will be described below by taking the transistor M1_b as an example.

The gate electrode of the transistor M1_b is connected to the gate electrode of the first transistor M1, the first electrode of the transistor M1_b is connected to the second electrode of the forty-third transistor M43, and the second electrode of the transistor M1_b is connected to the third node H. The gate electrode of the forty-third transistor M43 is connected to the third node H, and the first electrode of the forty-third transistor M43 is configured to receive the sixth voltage VB (for example, a high level). Under the case where the third node H is at a high level, the forty-third transistor M43 is turned on under control of the level of the third node H, so that the sixth voltage VB at a high level can be input to the first electrode of the transistor M1_b, so that both the first electrode and the second electrode of the transistor M1_b are at a high level, thereby preventing the electric charge at the third node H from leaking through the transistor M1_b. Under this case, because the gate electrode of the transistor M1_b is connected to the gate electrode of the first transistor M1, the combination of the first transistor M1 and the transistor M1_b can realize the same function as the aforementioned first transistor M1, and also has the effect of preventing electric leakage.

It should be noted that in the embodiment of the present disclosure, the sixth voltage VB is, for example, at a high level, and the following embodiments are the same and will not be described again.

In addition, it should be noted that the transistors in the second input circuit 300 provided in FIG. 8, FIG. 9A-FIG. 9F and FIG. 10 are all explained by taking N-type transistors as examples.

Figure 11A:
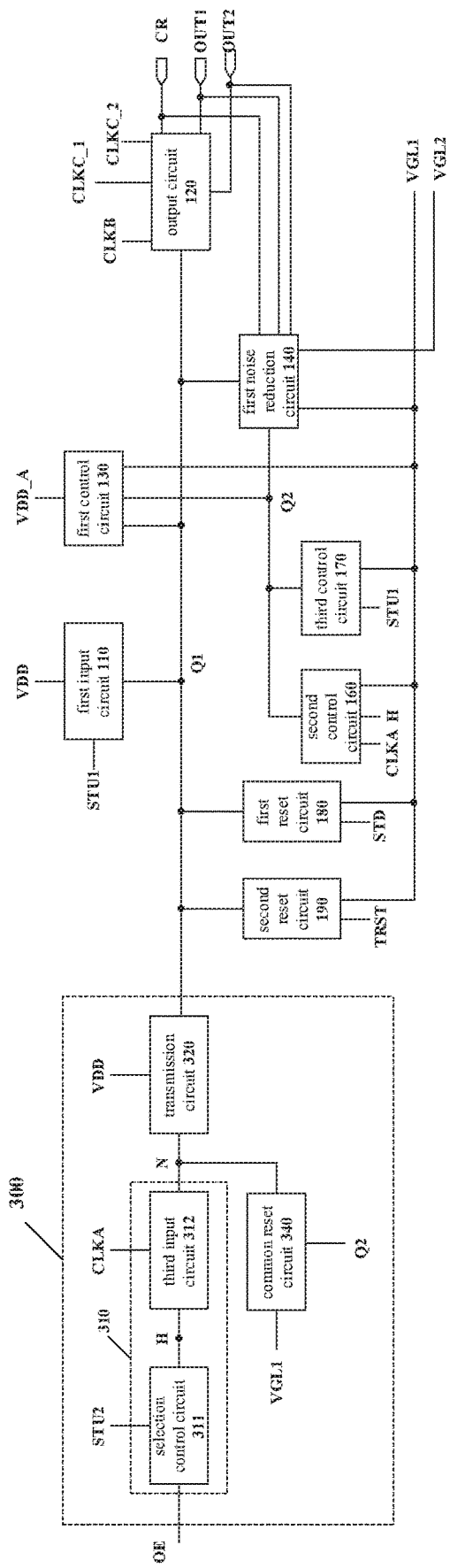
FIG. 11A is a schematic diagram of another shift register unit provided by some embodiments of the present disclosure.

FIG. 11A is a schematic block diagram of a shift register unit 21 included in the gate drive circuit 10 as shown in FIG. 1A provided by some embodiments of the disclosure. As shown in FIG. 11A, the output circuit 120 further includes a first output terminal OUT1, a second output terminal OUT2, and a shift output terminal CR, that is, the shift register unit in this example can output gate drive scan signals (for example, a first output signal, a second output signal, and a shift output signal) that drive two rows of sub-pixel units to operate at the first output terminal OUT1 and the second output terminal OUT2, respectively. As shown in FIG. 11A, the shift register unit 21 further includes a first control circuit 130 and a first noise reduction circuit 140.

The first control circuit 130 is connected to the first node Q1 and the second node Q2, and is configured to, under control of the level of the first node Q1 and the second voltage VDD_A, control the level of the second node Q2. For example, the first control circuit 130 is configured to receive the second voltage VDD_A and the fourth voltage VGL1. For example, in the case where the first node Q1 is at a high level, the first control circuit 130 may pull down the second node Q2 to a low level by using the fourth voltage VGL1 at a low level. For another example, in the case where the potential of the first node Q1 is at a low level, the first control circuit 130 may charge the second node Q2 by using the second voltage VDD_A (e.g., a high level) to pull the second node Q2 up to a high level.

The first noise reduction circuit 140 is connected to the second node Q2, the first node Q1, the first output terminal OUT1, the second output terminal OUT2, and the shift output terminal CR, and is configured to, under control of the level of the second node Q2, reset the first node Q1, the first output terminal OUT1, the second output terminal OUT2, and the shift output terminal CR. For example, the first noise reduction circuit 140 is configured to receive the fourth voltage VGL1 and the fifth voltage VGL2. For example, in the case where the first noise reduction circuit 140 is turned on under control of the level of the second node Q2, the first node Q1 and the shift output terminal CR can be pulled down and reset by the fourth voltage VGL1, and the first output terminal OUT1 and the second output terminal OUT2 can also be pulled down and reset by the fifth voltage VGL2. It should be noted that in some embodiments of the present disclosure, the first output terminal OUT1 and the second output terminal can also be pulled down and reset by the fourth voltage VGL1, and the present disclosure is not limited to this case. In addition, in the embodiments of the present disclosure, the fifth voltage VGL2 is, for example, at a low level, and the following embodiments are the same as the above and will not be described again. In the embodiment of the present disclosure, the fifth voltage VGL2 may be the same as or different from the fourth voltage VGL1.

As shown in FIG. 11A, the second input circuit 300 may further include a common reset circuit 340. The common reset circuit 340 is electrically connected to the fourth node N and the second node Q2, and is configured to, under control of the level of the second node Q2, reset the fourth node N. For example, the common reset circuit 340 may be configured to receive the fourth voltage VGL1, and in the case where the common reset circuit 340 is turned on under control of the level of the second node Q2, the fourth node N may be pulled down and reset by the fourth voltage VGL1.

In some embodiments of the present disclosure, by setting the common reset circuit 340, the level of the fourth node N can be better controlled. For example, in the case where it is not necessary to charge the first node Q1 or the second node Q2, the fourth node N is at a low level, and the transmission circuit 320 is turned off, thereby preventing the first node Q1 or the second node Q2 from being charged by the first voltage VDD at a high level, thereby preventing abnormal output, and improving the stability of the circuit.

It should be noted that in the embodiments of the present disclosure, each node (the first node Q1, the second node Q2, the third node H, the fourth node N, etc.) and each output terminal (the shift output terminal CR, the first output terminal OUT1, the second output terminal OUT2, etc.) are provided to better describe the circuit structure, and do not represent actual components. Nodes represent the junction points of related circuit connections in the circuit structure, that is, related circuits connected with the same node identification are electrically connected with each other. For example, as shown in FIG. 11A, the first control circuit 130, the first noise reduction circuit 1400, and the common reset circuit 340 are all connected to the second node Q2, which means that these circuits are electrically connected to each other.

Some embodiments of the present disclosure also provide a shift register unit 21. As shown in FIG. 11A, the shift register unit 21 further includes a second control circuit 160 and a third control circuit 170. The second control circuit 160 is configured to control the level of the second node Q2 in response to the fourth clock signal CLKA, and the second control circuit 160 is configured to control the level of the second node Q2 in response to the first input signal STU1.

For example, in some examples, the second control circuit 160 and the second node Q2 are connected, and is configured to receive the fourth clock signal CLKA and the fourth voltage VGL1. For example, in the blanking phase of one frame, the second control circuit 160 may be turned on in response to the fourth clock signal CLKA, thereby pulling down the second node Q2 by the fourth voltage VGL1 at a low level. For example, in other examples, the second control circuit 160 is also connected to the third node H. For example, in the blanking phase of one frame, in the case where the third node H is at a high level and the fourth clock signal CLKA is at a high level, the second control circuit 160 is turned on, so that the second node Q2 can be pulled down by the fourth voltage VGL1 at a low level.

For example, the third control circuit 170 is connected to the second node Q2, and is configured to receive the first input signal STU1 and the fourth voltage VGL1. For example, in the display phase of one frame, the third control circuit 170 is turned on in response to the first input signal STU1, thereby pulling down the second node Q2 by the fourth voltage VGL1 at a low level. Pulling down the second node Q2 to a low level can avoid the influence of the second node Q2 on the first node Q1, thus charging the first node Q1 more fully in the display phase.

As shown in FIG. 11A, the shift register unit 21 further includes a first reset circuit 180 and a second reset circuit 190. The first reset circuit 180 is configured to reset the first node Q1 in response to a display reset signal STD, and the second reset circuit 190 is configured to reset the first node Q1 in response to a global reset signal TRST.

For example, the first reset circuit 180 is connected to the first node Q1, and is configured to receive the display reset signal STD and the fourth voltage VGL1 to reset the first node Q1. For example, in the display phase of one frame, the first reset circuit 180 is turned on in response to the display reset signal STD, so that the first node Q1 can be pulled down and reset by the fourth voltage VGL1. For example, in the case where a plurality of shift register units 21 are cascaded to form the gate drive circuit 20, one stage of shift register unit 21 may receive the shift signal CR output by other stage of shift register unit 21 as the display reset signal STD.

For example, the second reset circuit 190 is connected to the first node Q1, and is configured to receive the global reset signal TRST and the fourth voltage VGL1 to reset the first node Q1. For example, in the case where a plurality of shift register units 21 are cascaded to form the gate drive circuit 20, before the display phase of one frame, the second reset circuit 190 in each shift register unit 21 is turned on in response to the global reset signal TRST, so that the first node Q1 can be pulled down and reset by the fourth voltage VGL1 at a low level, thereby realizing the global reset of the gate drive circuit 20.

Those skilled in the art will understand that although a plurality of control circuits and a plurality of reset circuits are shown in FIG. 11A, the above examples do not limit the scope of protection of the present disclosure. In practical application, those skilled in the art may choose to use or not to use one or more of the above circuits according to the situation. Based on the principle of the present disclosure, various combinations and variations of the above circuits do not depart from the present disclosure, which will not be described again.

Figure 11B:
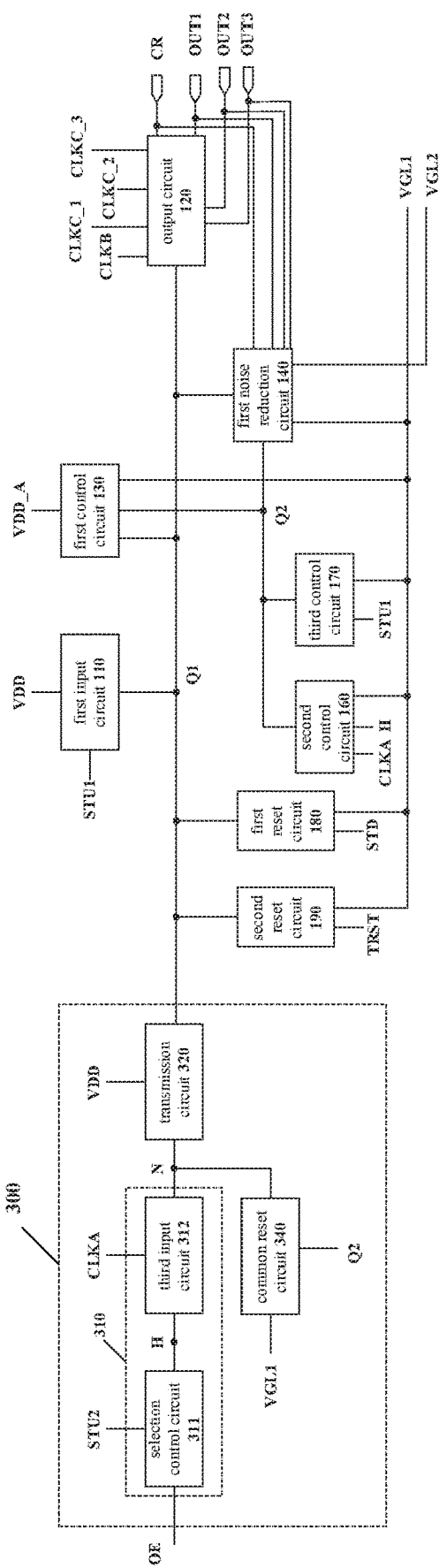
FIG. 11B is a schematic diagram of still another shift register unit provided by some embodiments of the present disclosure.

FIG. 11B is a schematic block diagram of a shift register unit 21 included in the gate drive circuit 10 as shown in FIG. 1B provided by some embodiments of the disclosure. As shown in FIG. 11B, on the basis of FIG. 11A, the output circuit 120 further includes a third output terminal OUT3, that is, the shift register unit in this example may output gate drive scan signals (for example, a first output signal, a second output signal, and a third output signal) that drive three rows of sub-pixel units to work at the first output terminal OUT1, the second output terminal OUT2, and the third output terminal OUT3, respectively.

For example, the output circuit 120 is also connected to a fifth clock signal terminal CLKC_3 to receive a fifth clock signal. In the case where the output circuit 120 is turned on under control of the first node Q1, the fifth clock signal terminal CLKC_3 is connected to the third output terminal OUT3 to output the fifth clock signal as the third output signal.

Other structures of the shift register unit as shown in FIG. 11B can be described with reference to FIG. 11A and will not be described here.

Figure 12A:
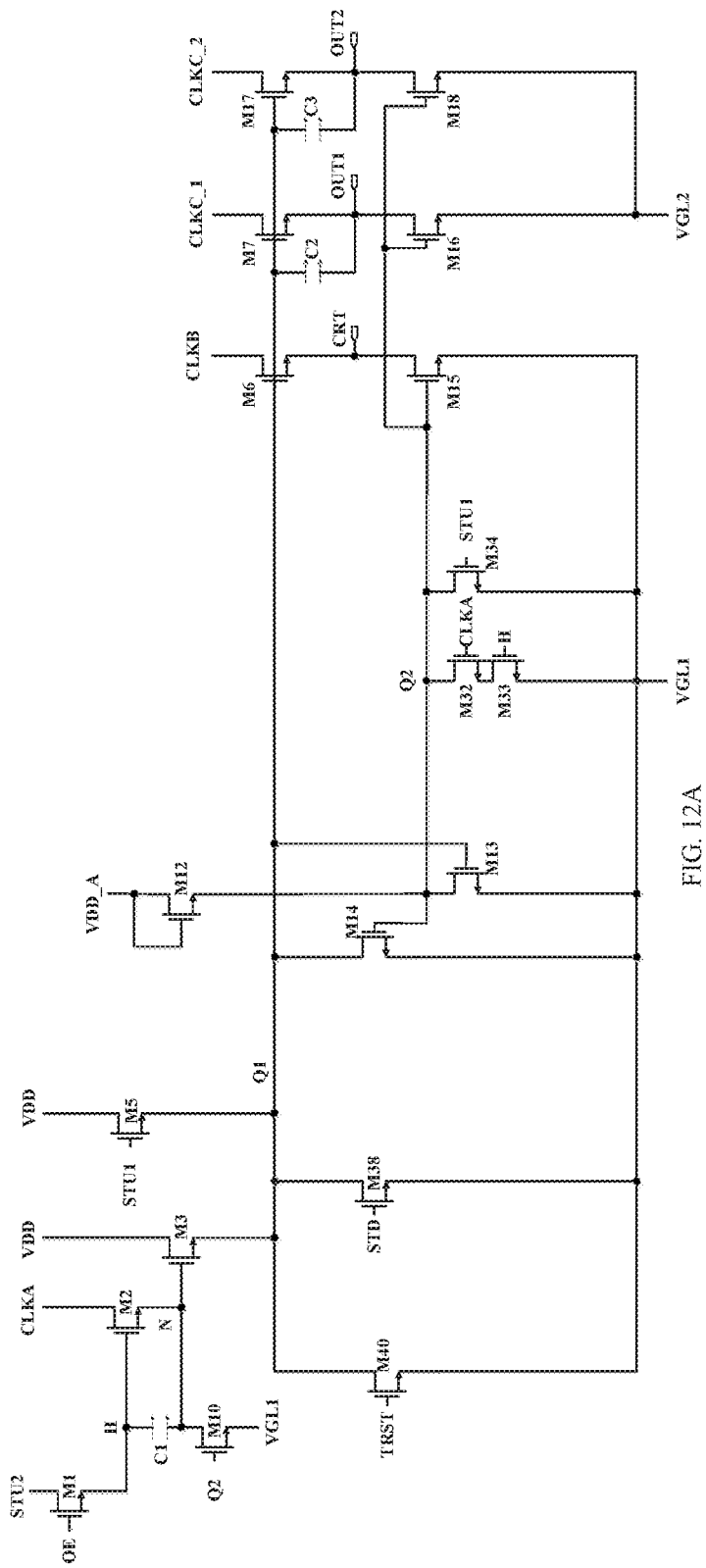
FIG. 12A is a circuit structure diagram of a specific implementation example of the shift register unit as shown in FIG. 11A.

In some embodiments of the present disclosure, the shift register unit 21 as shown in FIG. 11A may be implemented as a circuit structure as shown in FIG. 12A. As shown in FIG. 12A, the shift register unit 21 includes a first transistor M1 to a fortieth transistor M40, a first capacitor C1, a second capacitor C2, and a third capacitor C3. It should be noted that the transistors as shown in FIG. 12A are all illustrated by taking N-type transistors as examples, and the parts of the second input circuit 300 described above will not be described again here.

As shown in FIG. 12A, the first input circuit 110 may be implemented as a fifth transistor M5. A gate electrode of the fifth transistor M5 is configured to receive the first input signal STU1, a first electrode of the fifth transistor M5 is configured to receive the first voltage VDD, and a second electrode of the fifth transistor M5 is connected to the first node Q1.

Figure 13A:
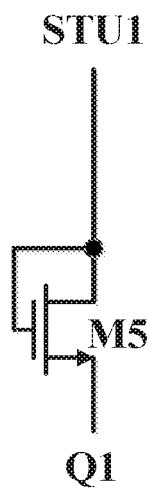
FIG. 13A to FIG. 13C are circuit diagrams of three examples of a first input circuit provided by some embodiments of the present disclosure.

For example, in other examples, as shown in FIG. 13A, the gate electrode of the fifth transistor M5 and the first electrode of the fifth transistor M5 are connected and configured to receive the first input signal STU1, so that in the case where the first input signal STU1 is at a high level, the first node Q1 is charged by the first input signal STU1 at a high level.

Figure 13B:
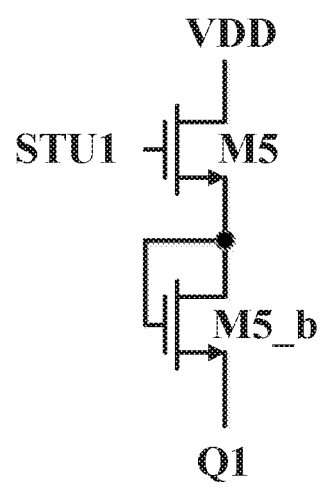

For example, in still other examples, as shown in FIG. 13B, the first input circuit 110 further includes a transistor M5_b. A gate electrode of the transistor M5_b and a second electrode of the transistor M5_b is connected to a second electrode of the fifth transistors M5, and a second electrode of the transistor M5_b is connected to the first node Q1. Because the transistor M5_b is adopted a diode connection way, a current can only flow from the first electrode of transistor M5_b to the second electrode of transistor M5_b, and cannot flow from the second electrode of transistor M5_b (that is, first node Q1) to the first electrode of transistor M5_b, thus avoiding electric leakage of the first node Q1 through the fifth transistor M5.

Figure 13C:
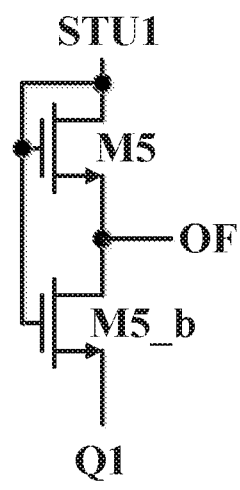

For example, in still other examples, as shown in FIG. 13C, the gate electrode of the transistor M5_b and the gate electrode of the fifth transistor M5 are connected, and both are configured to receive the first input signal STU1, and the first electrode of the transistor M5_b and a seventh node OF are connected. The first input circuit 110 as shown in FIG. 13C adopts an anti-leakage structure to prevent the first node Q1 from leaking electricity. It should be noted that the working principle of electric leakage prevention and the seventh node OF may refer to the above description of the transistor M1_b, which will not be repeated here.

As shown in FIG. 12A, the output circuit 120 may be implemented to include a third output transistor M6, a first output transistor M7, a second output transistor M17, a second capacitor C2, and a third capacitor C3. A gate electrode of the third output transistor M6 is connected to the first node Q1, a first electrode of the third output transistor M6 is configured to receive the third clock signal CLKB as the shift signal CR, and a second electrode of the third output transistor M6 is connected to the shift output terminal CR, and is configured to output the shift signal CR.

A gate electrode of the first output transistor M7 is connected to the first node Q1, a first electrode of the first output transistor M7 is configured to receive the first clock signal CLKC_1 as the first output signal OUT1, and a second electrode of the first output transistor M7 is connected to the first output terminal OUT1, and is configured to output the first output signal OUT1. A first electrode of the second capacitor C2 is connected to the first node Q1, and a second electrode of the second capacitor C2 is connected to the second electrode of the first output transistor M7 (that is, the first output terminal OUT1).

A gate electrode of the second output transistor M17 is connected to the first node Q1, a first electrode of the second output transistor M17 is configured to receive the second clock signal CLKC_2 as the second output signal OUT2, and a second electrode of the second output transistor M17 is connected to the second output terminal OUT2, and is configured to output the second output signal OUT2. A first electrode of the third capacitor C3 is connected to the first node Q1, and a second electrode of the third capacitor C3 is connected to the second output terminal OUT2.

Figure 12B:
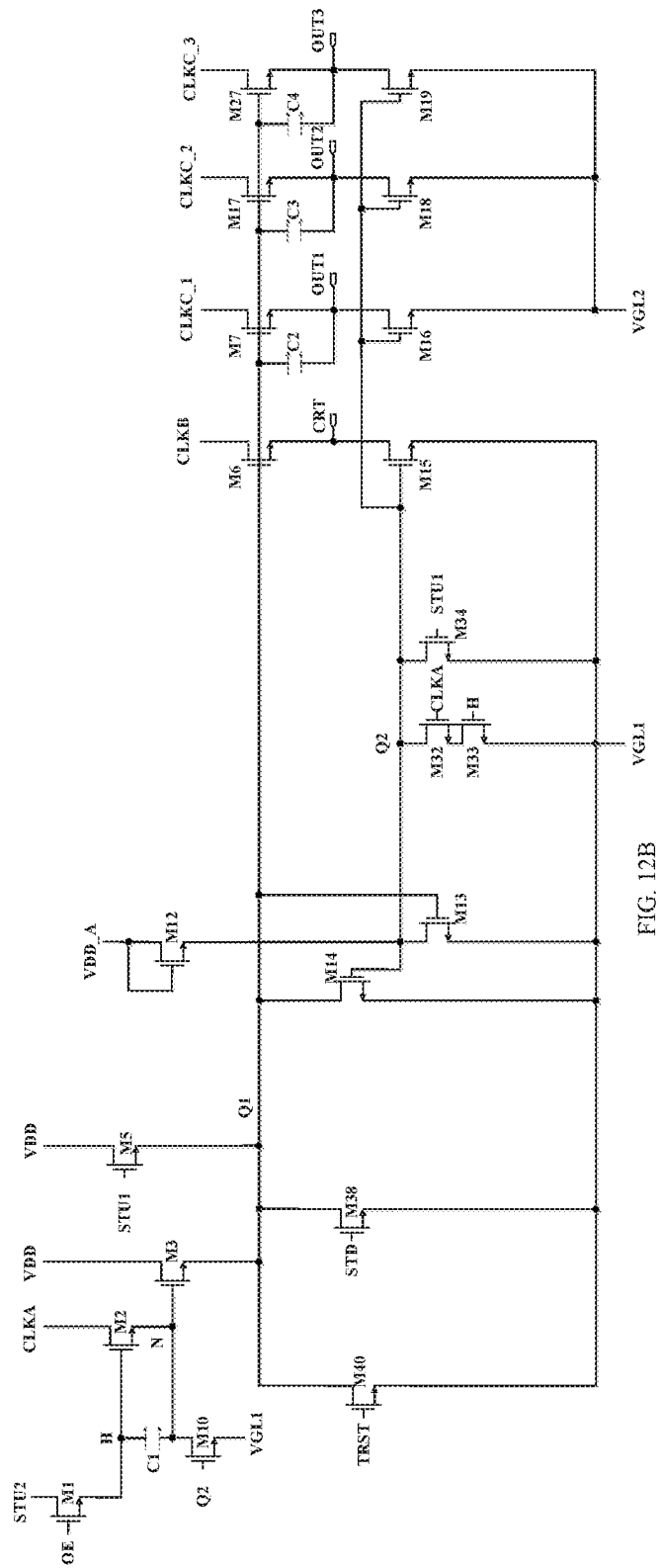
FIG. 12B is a circuit structure diagram of a specific implementation example of the shift register unit as shown in FIG. 11B.

As shown in FIG. 12B, the structure of the output circuit 120 is not limited to this case. In the case where the shift register unit adopts the structure as shown in FIG. 1B, the output circuit 120 may further include a fourth output transistor M27 and a fourth capacitor C4.

A gate electrode of the fourth output transistor M27 is connected to the first node Q1, a first electrode of the fourth output transistor M27 is configured to receive the fifth clock signal CLKC_3 as the third output signal OUT3, and a second electrode of the fourth output transistor M27 is connected to the third output terminal OUT3, and is configured to output the fourth output signal OUT3. A first electrode of the fourth capacitor C4 is connected to the first node Q1, and a second electrode of the fourth capacitor C4 is connected to the third output terminal OUT3.

It should be noted that more output transistors and capacitors can be included as required, and the embodiments of the present disclosure are not limited thereto.

As shown in FIG. 12A, the common reset circuit 340 may be implemented to include a tenth transistor M10. A gate electrode of the tenth transistor M10 is connected to the second node Q2, a first electrode of the tenth transistor M10 is connected to the fourth node N, and a second electrode of the tenth transistor M10 is configured to receive the fourth voltage VGL1.

As shown in FIG. 12A, the first control circuit 130 may be implemented to include a twelfth transistor M12 and a thirteenth transistor M13. A gate electrode of the twelfth transistor M12 and a first electrode of the twelfth transistor M12 are configured to receive the second voltage VDD_A, and a second electrode of the twelfth transistor M12 is connected to the second node Q2. A gate electrode of the thirteenth transistor M13 is connected to the first node Q1, a first electrode of the thirteenth transistor M13 is connected to the second node Q2, and a second electrode of the thirteenth transistor M13 is configured to receive the fourth voltage VGL1.

As shown in FIG. 12A, the first noise reduction circuit 140 may be implemented to include a fourteenth transistor M14, a fifteenth transistor M15, a sixteenth transistor M16, and an eighteenth transistor M18.

A gate electrode of the fourteenth transistor M14 is connected to the second node Q2, a first electrode of the fourteenth transistor M14 is connected to the first node Q1, and a second electrode of the fourteenth transistor M14 is configured to receive the fourth voltage VGL1. A gate electrode of the fifteenth transistor M15 is connected to the second node Q2, a first electrode of the fifteenth transistor M15 is connected to the shift output terminal CR, and a second electrode of the fifteenth transistor M15 is configured to receive the fourth voltage VGL1. A gate electrode of the sixteenth transistor M16 is connected to the second node Q2, a first electrode of the sixteenth transistor M16 is connected to the first output terminal OUT1, and a second electrode of the sixteenth transistor M16 is configured to receive the fifth voltage VGL2. A gate electrode of the eighteenth transistor M18 is connected to the second node Q2, a first electrode of the eighteenth transistor M18 is connected to the second output terminal OUT2, and a second electrode of the eighteenth transistor M18 is configured to receive the fifth voltage VGL2.

As shown in FIG. 12B, the first noise reduction circuit 140 may further include a nineteenth transistor M19. A gate electrode of the nineteenth transistor M19 is connected to the second node Q2, a first electrode of the nineteenth transistor M19 is connected to the third output terminal OUT3, and a second electrode of the nineteenth transistor M19 is configured to receive the fifth voltage VGL2.

In the shift register unit 21 as shown in FIG. 12A and FIG. 12B, the first control circuit 130 is provided in the shift register unit 21 to control the level of the second node Q2. In this way, the amount of transistors can be saved, thereby further reducing the area occupied by the gate drive circuit 20 adopting the shift register unit 21, further reducing the size of the bezel of the display device adopting the gate drive circuit 20, and improving the PPI of the display device.

As shown in FIG. 12A, the second control circuit 160 may be implemented to include a thirty-second transistor M32 and a thirty-third transistor M33. A gate electrode of the thirty-second transistor M32 is configured to receive the fourth clock signal CLKA, a first electrode of the thirty-second transistor M32 is connected to the second node Q2, and a second electrode of the thirty-second transistor M32 is connected to a first electrode of the thirty-third transistor M33. A gate electrode of the thirty-third transistor M33 is connected to the third node H, and a second electrode of the thirty-third transistor M33 is configured to receive the fourth voltage VGL1.

The third control circuit 170 may be implemented as a thirty-fourth transistor M34. A gate electrode of the thirty-fourth transistor M34 is configured to receive the first input signal STU1, a first electrode of the thirty-fourth transistor M34 is connected to the second node Q2, and a second electrode of the thirty-fourth transistor M34 is configured to receive the fourth voltage VGL1.

As shown in FIG. 12A, the first reset circuit 180 may be implemented as a thirty-eighth transistor M38, and the second reset circuit 190 may be implemented as a fortieth transistor M40. A gate electrode of the thirty-eighth transistor M38 is configured to receive the display reset signal STD, a first electrode of the thirty-eighth transistor M38 is connected to the first node Q1, and a second electrode of the thirty-eighth transistor M38 is configured to receive the fourth voltage VGL1. A gate electrode of the fortieth transistor M40 is configured to receive the global reset signal TRST, a first electrode of the fortieth transistor M40 is connected to the first node Q1, and a second electrode of the fortieth transistor M40 is configured to receive the fourth voltage VGL1.

It should be noted that in the display panel 10 provided by some embodiments of the present disclosure, for example, in the example as shown in FIG. 1A, the first output terminal OUT1 in the first stage of shift register unit is the first output terminal OT<1> of the gate drive circuit 20, and the second output terminal OUT2 in the first stage of shift register unit is the second output terminal OT<2>. The first output terminal OUT1 in the second stage of shift register unit is the third output terminal OT<3> of the gate drive circuit 20, the second output terminal OUT2 in the second stage of shift register unit is the fourth output terminal OT<4> of the gate drive circuit 20, and so on. For example, in the example as shown in FIG. 1B, the first output terminal OUT1 in the first stage of shift register unit is the first output terminal OT<1> of the gate drive circuit 20, the second output terminal OUT2 in the first stage of shift register unit is the second output terminal OT<2> of the gate drive circuit 20, and the third output terminal OUT3 in the first stage of shift register unit is the third output terminal OT<3>; the first output terminal OUT1 in the second stage of shift register unit is the fourth output terminal OT<4> of the gate drive circuit 20, the second output terminal OUT2 in the second stage of shift register unit is the fifth output terminal OT<5> of the gate drive circuit 20, the third output terminal OUT3 in the second stage of shift register unit is the sixth output terminal OT<6> of the gate drive circuit 20, and so on. The corresponding relationship between other stages of shift register unit 21 and the output terminals of the gate drive circuit 20 is similar to the above description and will not be described again.

As described above, in the plurality of cascaded shift register units 21 provided by the embodiments of the present disclosure, the potential at the third node H can be maintained by the first capacitor C1, and the potential at the first node Q1 can be maintained by the second capacitor C2 and the third capacitor C3. The first capacitor C1, the second capacitor C2, and the third capacitor C3 may be capacitor devices manufactured by a process. For example, a special capacitor electrode is manufactured to realize a capacitor device, and each electrode of these capacitors may be realized by a metal layer, a semiconductor layer (for example, doped polysilicon), or the like, or in some examples, the first capacitor C1, the second capacitor C2, and the third capacitor C3 may also be realized by parasitic capacitances among the various devices by designing circuit wiring parameters. The connection method of the first capacitor C1, the second capacitor C2 and the third capacitor C3 is not limited to the above-described mode, but may be other suitable connection methods as long as the levels written to the third node H, the first node Q1 and the second node Q2 can be stored.

The transistors adopted in the embodiments of the present disclosure may be thin film transistors, or field effect transistors, or other switching devices with the same characteristics, and the embodiments of the present disclosure are all described by taking the thin film transistors as an example. The source electrode and the drain electrode of the transistor used here can be symmetrical in structure, so the source electrode and the drain electrode can be structurally indistinguishable. In the embodiments of the present disclosure, in order to distinguish the two electrodes of the transistor except the gate electrode, one electrode is directly described as the first electrode, and the other electrode is described as the second electrode. In addition, transistors can be divided into N-type transistors and P-type transistors according to their characteristics. In the case where the transistors is a P-type transistors, a turn-on voltage is a low level voltage (for example, 0V, −5V, −10V or other suitable voltage), and a turn-off voltage is a high level voltage (for example, 5V, 10V or other suitable voltage); in the case where the transistor is an N-type transistor, the turn-on voltage is a high level voltage (for example, 5V, 10V or other suitable voltage), and the turn-off voltage is a low level voltage (for example, 0V, −5V, −10V or other suitable voltage).

Figure 14:
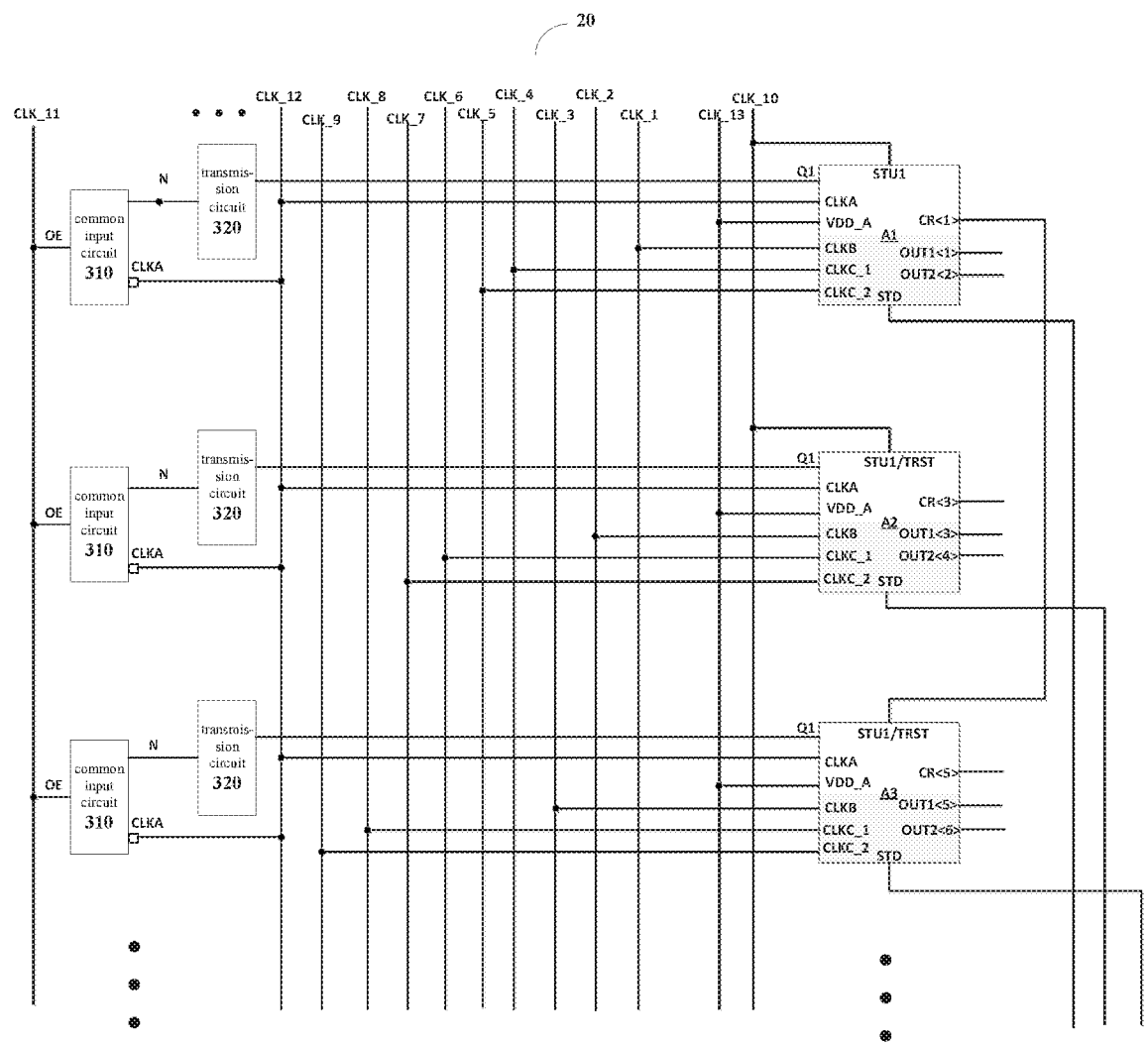
FIG. 14 is a schematic diagram of a gate drive circuit provided by some embodiments of the present disclosure.

Some embodiments of the present disclosure also provide a gate drive circuit 20. As shown in FIG. 14, the gate drive circuit 20 includes a plurality of cascaded shift register units 21, and any one or more of the plurality of cascaded shift register units 21 may adopt the structure of the shift register unit 21 provided by the embodiments of the present disclosure or variations thereof. For example, in the example as shown in FIG. 14, the shift register unit 21 is described with the structure of the shift register unit 21 as shown in FIG. 11A. A1, A2, and A3 in FIG. 14 represent three shift register units 21 which are cascade.

For example, as shown in FIG. 14, each shift register unit 21 includes a first output terminal OUT1, a second output terminal OUT2, and a shift output terminal CR to output a first output signal OUT1, a second output signal OUT2, and a shift signal CR, respectively. In the case where the gate drive circuit 20 is configured to drive a plurality of rows of sub-pixel units in the display panel 10, the first output signal OUT1 and the second output signal OUT2 may respectively drive one row of sub-pixel units in the display panel 10. For example, A1, A2, A3 may respectively drive a first row of sub-pixel units and a second row of sub-pixel units, a third row of sub-pixel units and a fourth row of sub-pixel units, and a fifth row of sub-pixel units and a sixth row of sub-pixel units of the display panel 10.

Next, signal lines in the gate drive circuit 20 will be described by taking the gate drive circuit 20 as shown in FIG. 14 as an example.

As shown in FIG. 14, the gate drive circuit 20 includes a first sub-clock signal line CLK_1, a second sub-clock signal line CLK_2, and a third sub-clock signal line CLK_3. The third clock signal terminal CLKB in a (3k−2)-th (k is an integer greater than zero) stage of shift register unit is connected to the first sub-clock signal line CLK_1 to receive the third clock signal CLKB of the (3k−2)-th stage of shift register unit. The third clock signal terminal CLKB in a (3k−1)-th stage of shift register unit is connected to the second sub-clock signal line CLK_2 to receive the third clock signal CLKB of the (3k−1)-th stage of shift register unit. The third clock signal terminal CLKB in a (3k)-th stage of shift register unit is connected to the third sub-clock signal line CLK_3 to receive the third clock signal CLKB of the (3k)-th stage of shift register unit.

As described above, in the case where the shift register units 21 are cascaded, it is only necessary to sequentially supply the third clock signal CLKB to the first sub-unit in each stage of the shift register unit 21, and the third clock signal CLKB can be output as the shift signal CR to complete a scanning shift.

As shown in FIG. 14, the gate drive circuit 20 further includes a fourth sub-clock signal line CLK_4, a fifth sub-clock signal line CLK_5, a sixth sub-clock signal line CLK_6, a seventh sub-clock signal line CLK_7, an eighth sub-clock signal line CLK_8, and a ninth sub-clock signal line CLK_9, a fifteenth sub-clock signal line CLK_15, a sixteenth sub-clock signal line CLK_16, a seventeenth sub-clock signal line CLK_17, and an eighteenth sub-clock signal line CLK_18. It should be noted that, for clarity of illustration, FIG. 14 does not show the fifteenth sub-clock signal line CLK_15, the sixteenth sub-clock signal line CLK_16, the seventeenth sub-clock signal line CLK_17, and the eighteenth sub-clock signal line CLK_18.

The first clock signal terminal CLKC_1 in the (3k−2)-th stage of shift register unit is connected to the fourth sub-clock signal line CLK_4 to receive the first clock signal CLKC_1 of the (3k−2)-th stage of shift register unit, and the second clock signal terminal CLKC_2 in the (3k−2)-th stage if shift register unit is connected to the fifth sub-clock signal line CLK_5 to receive the second clock signal CLKC_2 of the (3k−2)-th stage of shift register unit.

The first clock signal terminal CLKC_1 in the (3k−1)-th stage of shift register unit is connected to the sixth sub-clock signal line CLK_6 to receive the first clock signal CLKC_1 of the (3k−1)-th stage of shift register unit, and the second clock signal terminal CLKC_2 in the (3k−1)-th stage of shift register unit is connected to the seventh sub-clock signal line CLK_7 to receive the second clock signal CLKC_2 of the (3k−1)-th stage of shift register unit.

The first clock signal terminal CLKC_1 in the (3k)-th stage of shift register unit is connected to the eighth sub-clock signal line CLK_8 to receive the first clock signal CLKC_1 of the (3k)-th stage of shift register unit, and the second clock signal terminal CLKC_2 in the (3k)-th stage of shift register unit is connected to the ninth sub-clock signal line CLK_9 to receive the second clock signal CLKC_2 of the (3k)-th stage of shift register unit.

Figure 15:
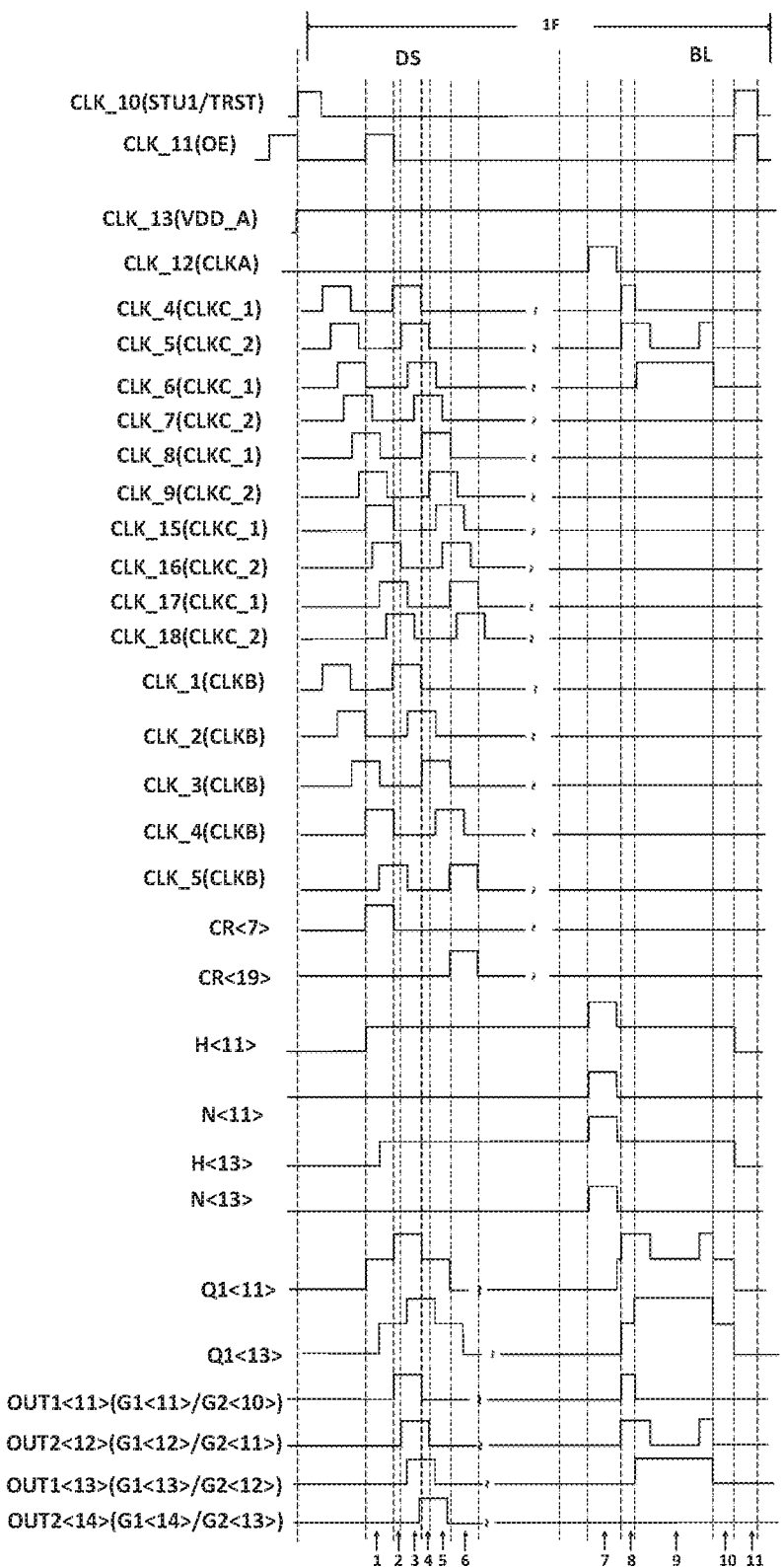
FIG. 15 is a signal timing diagram corresponding to an operation of the gate drive circuit as shown in FIG. 14 provided by some embodiments of the present disclosure.

As mentioned above, a total of ten clock signal lines including the fourth sub-clock signal line CLK_4, the fifth sub-clock signal line CLK_5, the sixth sub-clock signal line CLK_6, the seventh sub-clock signal line CLK_7, the eighth sub-clock signal line CLK_8, the ninth sub-clock signal line CLK_9, the fifteenth sub-clock signal line CLK_15, the sixteenth sub-clock signal line CLK_16, the seventeenth sub-clock signal line CLK_17, and the eighteenth sub-clock signal line CLK_18 are used to provide row-by-row output drive signals to all stages of shift register units 21 (referring to FIG. 15 for specific signal timing). That is, the gate drive circuit 20 provided by the embodiments of the present disclosure can adopt ten clock signals 10CLK, which can enable the waveforms of the drive signals output by the gate drive circuit 20 overlap, for example, the precharge time of each row of sub-pixel units can be increased, so that the gate drive circuit 20 can be suitable for high-frequency scanning display.

As shown in FIG. 14, the gate drive circuit 20 further includes a tenth sub-clock signal line CLK_10, an eleventh sub-clock signal line CLK_11, and a twelfth sub-clock signal line CLK_12.

As shown in FIG. 14, in this embodiment, the tenth sub-clock signal line CLK_10 is connected to the first stage of shift register unit A1 and the second stage of shift register unit A2 to provide the first input signal STU1, while the tenth sub-clock signal line CLK_10 is also connected to other stages of shift register units 21 to provide the global reset signal TRST. In this way, the amount of clock signal lines can be saved, so that the size of the bezel of the display device adopting the gate drive circuit 20 can be reduced, and the PPI of the display device can be improved. For example, the fortieth transistor M40 may not be provided for the previous two stages of shift register units 21.

The common input circuits 310 in each stage of the shift register unit 21 are connected to the eleventh sub-clock signal line CLK_11 to receive the selection control signal OE. The fifth clock signal terminals CLKA in each stage of shift register unit 21 are connected to the twelfth sub-clock signal line CLK_12 to receive the fourth clock signal CLKA.

As shown in FIG. 14, the gate drive circuit 20 further includes a thirteenth sub-clock signal line CLK_13. For example, each stage of shift register unit 21 is connected to the thirteenth sub-clock signal line CLK_13 to receive the second voltage VDD_A.

As shown in FIG. 14, in addition to the previous two stages of shift register units 21, the other stages of shift register units 21 are connected to the shift output terminals CR in the previous two stages of shift register units 21 to receive the shift signal CR as the first input signal STU1.

Except for the last four stages of shift register units 21, the display reset terminals STD in the other stages of shift register units 21 are connected to the shift output terminals CR in the last four stages of shift register units 21 to receive the shift signal CR as the display reset signal STD.

It should be noted that the cascade relation as shown in FIG. 14 is only an example. According to the description of the present disclosure, other cascade modes can also be adopted according to the actual situation. For example, in the case where the gate drive circuit as shown in FIG. 14 adopts the shift register unit as shown in FIG. 11B or other various examples, the amount of output terminals of each stage of shift register unit in the gate drive circuit 20, the cascade relationship between the shift register units, and the timing of the clock signal can be changed according to requirements, and will not be repeated here.

It should also be noted that in order to show clearly and concisely, only the first stage of shift register unit A1, the second stage of shift register unit A2, and the third stage of shift register unit A3 are shown schematically in FIG. 14, and the gate drive circuit 20 also includes a plurality of shift register units cascaded sequentially. The embodiments of the present disclosure is not limited to this case, and the cascade mode can refer to the cascade mode described above and will not be repeated here.

For example, in some examples, the shift register unit 21 in the gate drive circuit 20 as shown in FIG. 14 may adopt the circuit structure as shown in FIG. 12A, and FIG. 15 shows a signal timing diagram corresponding to an operation of the gate drive circuit as shown in FIG. 14.

In FIG. 15, H<11> and H<13> represent the third node H in the sixth stage of shift register unit and the seventh stage of shift register unit (not shown in FIG. 14 for clarity and conciseness), respectively. The two gate scan signals output by the sixth stage of shift register unit 21 can drive sub-pixel units corresponding to an eleventh row and a twelfth row in the display panel, and the two gate scan signals output by the seventh stage of shift register unit 21 can drive sub-pixel units corresponding a the thirteenth row and a fourteenth row in the display panel. N<11> and N<13> represent the fourth node N in the sixth stage of shift register unit 21 and the seventh stage of shift register unit 21, respectively.

Q1<11> represents the first node Q1 in the sixth stage of shift register unit 21; Q1<13> represents the first node Q1 in the seventh stage of shift register unit 21. The numbers in parentheses indicate the number of the row of sub-pixel units in the display panel corresponding to the node. The following embodiments are the same as this case and will not be described in detail.

OUT1<11> and OUT2<12> respectively represent a first output signal OUT1 output by the first output terminal OUT1<11> of the sixth stage of shift register unit 21 and a second output signal OUT2 output by the second output terminal OUT1<12> of the sixth stage of shift register unit 21. Similarly, OUT1<13> and OUT2<14> respectively represent the first output signal OUT1 output by the first output terminal OUT1<11> of the seventh stage of shift register unit 21 and the second output signal OUT2 output by the second output terminal OUT1<12> of the seventh stage of shift register unit 21.

1F represents a first frame, DS represents the display phase of the first frame, BL represents the blanking phase of the first frame. The signal level in the signal timing diagram as shown in FIG. 15 is only schematic and does not represent the true level value.

Next, the working principle of the gate drive circuit 20 as shown in FIG. 14 will be described with reference to the signal timing diagram in FIG. 15 and the shift register unit 21 as shown in FIG. 12A.

Before the start of the first frame 1F, the tenth sub-clock signal line CLK_10 and the eleventh sub-clock signal line CLK_11 provide a high level, and the fortieth transistor M40 in each stage of shift register unit 21 is turned on, so that the first node Q1 in each stage of shift register unit 21 can be reset. The first transistor M1 in each stage of shift register unit 21 is turned on. Because the second input signal STU2 received at this time is at a low level, the third node H in each stage of shift register unit 21 can be reset, thereby realizing global reset before the start of the first frame 1F.

In the display phase DS of the first frame 1F, the working process for the sixth stage of shift register units 21 and the seventh stage of shift register units 21 (that is, the sub-pixel units corresponding to the eleventh row to the fourteenth row of the display panel) are described as follows.

In a first phase 1, the shift signal (signal provided by the fifteenth sub-clock signal line CLK_15) output by the shift output terminal CR in the fourth stage of shift register unit 21 is at a high level, that is, the first input signal STU1 received by the sixth stage of shift register unit 21 is at a high level, so the fifth transistor M5 is turned on. The first voltage VDD at a high level charges the first node Q1<11> through the fifth transistor M5, thereby pulling up the first node Q1<11> to a high level.

The first output transistor M7 is turned on under control of the first node Q1<11>, but because the first clock signal CLKC_1 provided by the fourth sub-clock signal line CLK_4 is at a low level at this time, the first output signal OUT1<11> output by the first output terminal OUT<11> of the sixth stage of shift register unit 21 is at a low level. At this phase, the precharge of the first node in the sixth stage of shift register unit 21 is completed simultaneously.

In a second phase 2, the first clock signal CLKC_1 provided by the fourth sub-clock signal line CLK_4 becomes at a high level, the potential of the first node Q1<11> is further pulled up to a high level due to the bootstrap effect, so that the first output transistor M7 remains to be turned on, and thus the first output signal OUT1<11> output by the first output terminal OUT<11> of the sixth stage of shift register unit 21 becomes at a high level. However, because the second clock signal CLKC_2 provided by the fifth sub-clock signal line CLK_5 is still at a low level at this time, the second output signal OUT2<12> output by the second output terminal OUT<12> of the sixth stage of shift register unit 21 continues to remain at a low level.

In a third phase 3, the second clock signal CLKC_2 provided by the fifth sub-clock signal line CLK_5 becomes at a high level, the first node Q1<11> keeps the level in the second stage 2 unchanged, and the second output transistor M17 keeps to be turned on, so that the second output signal OUT2<12> output by the second output terminal OUT<12> of the sixth stage of shift register unit 21 becomes at a high level.

In a fourth phase 4, the first node Q1<11> remains at a high level due to the holding effect of the second capacitor C2, so that the first output transistor M7 is turned on. However, because the first clock signal CLKC_1 provided by the fourth sub-clock signal line CLK_4 becomes at a low level, the first output signal OUT1<11> of the first output terminal OUT<11> output by the sixth stage of shift register unit 21 becomes at a low level. At the same time, due to the bootstrap effect of the second capacitor C2, the potential of the first node Q1<11> will also drop.

In a fifth phase 5, the first node Q1<11> remains at the level in the fourth stage 4 due to the holding effect of the third capacitor C3, so that the second output transistor M17 is still turned on. However, because the second clock signal CLKC_2 provided by the fifth sub-clock signal line CLK_5 becomes at a low level, the second output signal OUT2<12> output by the second output terminal OUT<12> of the sixth stage of shift register unit 21 becomes at a low level. Meanwhile, due to the bootstrap effect of the third capacitor C3, the potential of the first node Q1<11> will also drop.

In a sixth phase 6, because the present embodiment uses ten clock signals 10CLK, the signal output by each five stages of shift register units 21 (each stage sequentially outputs the first output signal OUT1 and the second output signal OUT2) is one cycle, and at the same time, because the sixth stage of shift register unit 21 receives the shift signal CR<19> output by the tenth stage of shift register unit 21 as the display reset signal STD. Therefore, at this phase, in the case where the first clock signal CLKC_1 provided by the seventeenth sub-clock signal line CLK_17 becomes at a high level, the display reset signal STD received by the sixth stage of shift register unit 21 is also at a high level, so that the thirty-eighth transistor M38 is turned on, and thus the first node Q1<11> can be reset by the fourth voltage VGL1 at a low level.

After the sixth stage of shift register unit 21 drives the eleventh row of sub-pixel units and the twelfth row of sub-pixel units in the display panel to complete the display, and so on, the seventh stage of shift register unit 21 and the eighth stage of shift register units 21 drive the sub-pixel units in the display panel row by row to complete the display drive of one frame. Under this case, the display phase of the first frame ends.

Under this case, the third node H<11> in the sixth stage of shift register unit is also charged in the display phase DS of the first frame 1F. For example, in the case where the twelfth row of sub-pixel units need to be sensed in the first frame 1F, the following operations are also performed in the display phase DS of the first frame 1F.

In the first phase 1, the selection control signal OE provided by the eleventh sub-clock signal line CLK_11 and the shift signal (signal provided by the fifteenth sub-clock signal line CLK_15) output by the shift output terminal CR<7> in the fourth stage of shift register unit 21 are made the same, so that the first transistor M1 is turned on. At the same time, the second input signal STU2 received by the sixth stage of shift register unit 21 and the shift signal output by the shift output terminal CR<7> in the fourth stage of shift register unit 21 can be the same, so that the second input signal STU2 at a high level can charge the third node H<11> and pull up the third node H<11> to a high level.

It should be noted that the above charging process for the third node H<11> is only an example, and embodiments of the present disclosure include but are not limited to this case. For example, the second input signal STU2 received by the sixth stage of shift register unit 21 may be the same as the shift signals output by the other stages of shift register units 21, while the signal timing of the signal supplied to the eleventh sub-clock signal line CLK_11 and the signal timing of the second input signal STU2 may be the same.

In the first phase 1, because the adopted ten clock signals 10CLK are overlapped, in the case where the selection control signal OE is at a high level, the third node H<13> in the seventh stage of shift register unit is also charged to a high level.

The high potential of H<11> and the high potential H<13> can be maintained until the blanking phase BL of the first frame 1F. In the case where the compensation is required for the twelfth row of sub-pixel units in the first frame 1F, the following operation is performed in the blanking phase BL of the first frame 1F.

In a seventh phase 7, the fourth clock signal CLKA provided by the twelfth sub-clock signal line CLK_12 is at a high level. For the sixth stage of shift register unit, because the third node H<11> remains at a high level in this phase, the second transistor M2 is turned on, and the fourth clock signal CLKA at a high level is transmitted to the fourth node N<11> through the second transistor M2, thereby causing the fourth node N<11> to become at a high level. The third transistor M3 and the fourth transistor M4 are turned on under control of the fourth node N<11>, so that the high-level first voltage VDD can respectively charge the first node Q1<11>, and the potential of the first node Q1<11> is pulled up.

At the same time, in the seventh phase 7, due to the coupling effect of the first capacitor C1, in the case where the fourth node N<11> changes from a low level to a high level, the third node H<11> will be coupled and pulled up, so that the third node H<11> can be kept at a higher high potential, and the second transistor M2 can be fully turned on.

Then, the fourth clock signal CLKA provided by the twelfth sub-clock signal line CLK_12 changes from a high level to a low level, so that the fourth node N<11> changes to a low level. Due to the coupling effect of the first capacitor C1, the potential of the third node H<11> also drop.

Similarly, for the seventh stage of shift register unit, the change process of the third node H<13>, the fourth node N<13>, and the first node Q1<13> can refer to the above description of the sixth stage of shift register unit, which is not repeated here.

In an eighth phase 8, the first clock signal CLKC_1 provided by the fourth sub-clock signal line CLK_4 becomes a high level, and the potential of the first node Q1<11> is further pulled up due to the bootstrap effect, so that the first output transistor M7 remains to be turned on, and thus the first output signal OUT1<11> output by the sixth stage of shift register unit 21 becomes a high level.

At the same time, in the eighth phase 8, the second clock signal CLKC_2 provided by the fifth sub-clock signal line CLK_5 becomes a high level. Because the potential of the first node Q1<11> is a high level, the second output transistor M17 remains to be turned on, so that the second output signal OUT2<12> output by the second output terminal OUT2<12> of the sixth stage of shift register unit 21 becomes at a high level.

It should be noted that in the eighth phase 8, in the case where the first clock signal CLKC_1 provided by the fourth sub-clock signal line CLK_4 and the second clock signal CLKC_2 provided by the fifth sub-clock signal line CLK_5 become at a low level, accordingly, the potential of the first node Q1<11> in the sixth stage of shift register unit 21, the potential of the first output signal OUT1<11>, and the potential of the second output signal OUT2<12> also drop. Similarly, correspondingly, the potential of the second node Q2<12> and the potential of the second output signal OUT2<12> in the sixth stage of shift register unit 21 also drop.

In a ninth phase 9, the second clock signal CLKC_2 provided by the fifth sub-clock signal line CLK_5 become at a high level, the potential of the second node Q2<12> is further pulled up due to the bootstrap effect, so that the ninth transistor M9 remains to be turned on, and thus the second output signal OUT2<12> output by the sixth stage of shift register unit 21 become at a high level.

At the same time, in the ninth phase 9, the first clock signal CLKC_1 provided by the sixth sub-clock signal line CLK_6 become at a high level, the potential of the first node Q1<13> is further pulled up due to the bootstrap effect, so that the first output transistor M7 remains to be turned on, and thus the first output signal OUT1<13> output by the seventh stage of shift register unit 21 become at a high level.

It should be noted that in the ninth phase 9, in the case where the second clock signal CLKC_2 provided by the fifth sub-clock signal line CLK_5 become at a low level, the potential of the second output signal OUT2<12> output by the second output terminal OUT2<12> of the sixth stage of shift register unit 21 correspondingly drops.

In a tenth phase 10, the second clock signal CLKC_2 provided by the fifth sub-clock signal line CLK_5 become at a low level, and accordingly, the potential of the first node Q1<12> and the potential of the second output signal OUT2<12> in the sixth stage of shift register unit 21 also drop.

At the same time, in the tenth phase 10, the first clock signal CLKC_1 provided by the sixth sub-clock signal line CLK_6 become at a low level, and accordingly, the potential of the first node Q1<13> and the potential of the first output signal OUT1<13> in the seventh stage of shift register unit 21 also drop.

In the eleventh phase 11, the tenth sub-clock signal line CLK_10 and the eleventh sub-clock signal line CLK_11 provide a high level, and the fortieth transistor M40 in each stage of shift register unit 21 is turned on, so that the first node Q1 in each stage of shift register unit 21 can be reset. The first transistor M1 in each stage of shift register unit 21 is turned on. Because the second input signal STU2 received at this time is at a low level, the third node H in each stage of shift register unit 21 can be reset, thus completing the global reset.

Under this case, the drive timing of the first frame ends. Subsequent driving of the gate drive circuit in more stages, such as the second frame and the third frame can refer to the above description and will not be described here again.

It should be noted that in the embodiments of the present disclosure, the same timing of the two signals refers to time synchronization at a high level without requiring the same amplitude of the two signals.

Figure 16:
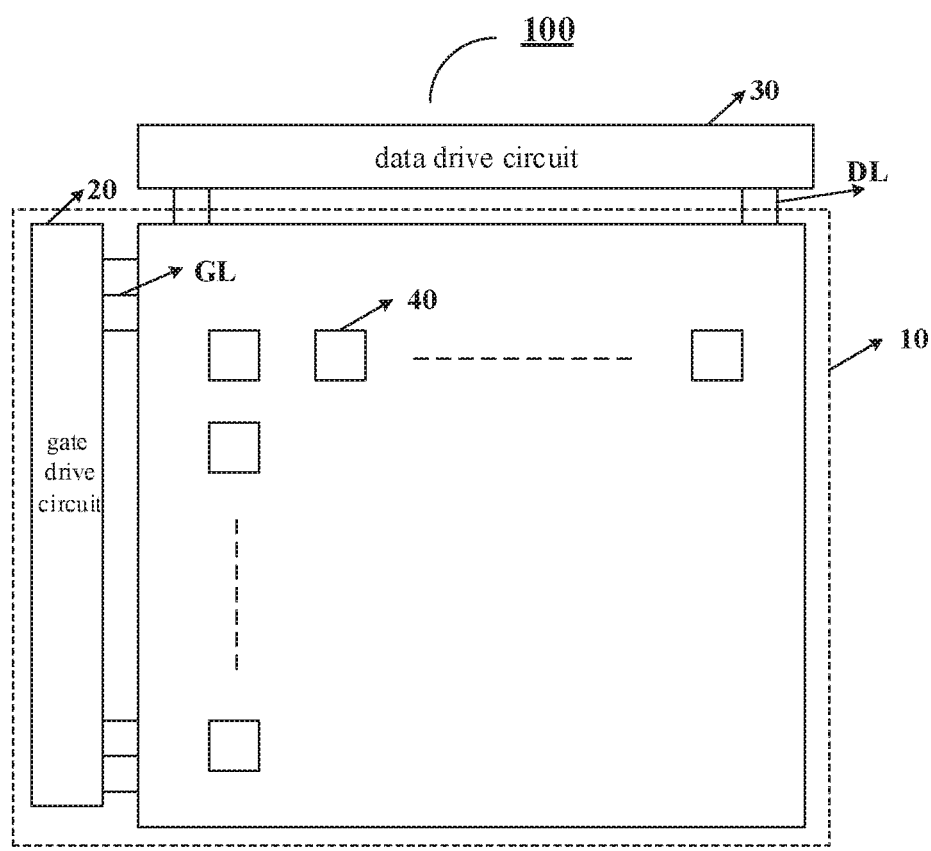
FIG. 16 is a schematic diagram of a display device provided by some embodiments of the present disclosure.

The embodiments of the present disclosure also provide a display device 100. As shown in FIG. 16, the display device 100 includes the display panel 10 provided in any embodiment of the present disclosure, and a pixel array composed of a plurality of sub-pixel units 40 is disposed in the display panel 10.

The first output signal OUT1 output by the first output terminal OUT1 and the second output signal OUT2 output by the second output terminal OUT2 of each stage of shift register unit in the gate drive circuit 20 are respectively supplied to different rows of sub-pixel units 40. For example, the gate drive circuit 20 is electrically connected to the sub-pixel units 40 through the gate lines GL. The gate drive circuit 20 is configured to provide a drive signal to the pixel array, for example, the drive signal may drive the scan transistors and the sensing transistors in the sub-pixel units 40.

For example, the display device 100 may further include a data drive circuit 30 for providing data signals to the pixel array. For example, the data drive circuit 30 is electrically connected to the sub-pixel units 40 through the data lines DL.

It should be noted that the display device 100 in this embodiment can be any product or component with a display function, such as a display, an OLED panel, an OLED television, a mobile phone, a tablet computer, a notebook computer, a digital photo frame, a navigator, etc.

The technical effect of the display device 100 provided by the embodiments of the present disclosure may refer to the corresponding description of the display panel 10 in the above embodiments, which is not repeated here.

What are described above is related to illustrative embodiments of the disclosure only, and not limitative to the protection scope of the present disclosure. The protection scope of the present disclosure should be defined by the accompanying claims.

What is claimed is:

1. A display panel, comprising a plurality of sub-pixel units arranged in an array and a gate drive circuit, wherein the array comprises N rows;

each of the plurality of sub-pixel units comprises a light-emitting unit, a pixel drive circuit configured to drive the light-emitting unit to emit light, and a sensing circuit configured to sense the pixel drive circuit;

the gate drive circuit comprises a plurality of cascaded shift register units and N+1 output terminals arranged in sequence, each of the plurality of cascaded shift register units is configured to output a gate scan signal for driving at least two rows of sub-pixel units in the N rows of the array to work; and pixel drive circuits of an (n)-th row of sub-pixel units are connected to an (n)-th output terminal of the gate drive circuit to receive the gate scan signal as a scan drive signal, and sensing circuits of the (n)-th row of sub-pixel units are connected to an (n+1)-th output terminal of the gate drive circuit to receive the gate scan signal as a sensing drive signal, wherein each of the plurality of cascaded shift register units is configured to output a gate scan signal for driving two rows of sub-pixel units in the N rows of the array to work;

an (x)-th stage of shift register unit comprises a first output terminal and a second output terminal which serve as a (2x−1)-th output terminal and a (2x)-th output terminal among the N+1 output terminals arranged in sequence, respectively, a first output terminal of the (x)-th stage of shift register unit is connected to pixel drive circuits of a (2x−1)-th row of sub-pixel units to provide the gate scan signal as the scan drive signal, and is further connected to sensing circuits of a (2x−2)-th row of sub-pixel units to provide the gate scan signal as the sensing drive signal, a second output terminal of the (x)-th stage of shift register unit is connected to pixel drive circuits of a (2x)-th row of sub-pixel units to provide the gate scan signal as the scan drive signal, and is further connected to sensing circuits of the (2x−1)-th row of sub-pixel units to provide the gate scan signal as the sensing drive signal; and in a case where N is an odd number greater than 2, $1 < x \leq (N-1)/2$, and in a case where N is an even number greater than or equal to 2, $1 < x \leq N/2$, wherein, $1 \leq n \leq N$, N is an integer greater than or equal to 2.

2. The display panel according to claim 1, wherein the pixel drive circuit of each of the plurality of sub-pixel units comprises a data write circuit and a drive circuit;

the drive circuit is connected to the data write circuit, the light-emitting unit, and the sensing circuit, and is configured to control a drive current for driving the light-emitting unit to emit light;

the data write circuit is configured to receive the scan drive signal and, in response to the scan drive signal, write a data signal to the drive circuit; and the sensing circuit is further connected to the drive circuit and configured to receive the sensing drive signal and, in response to the sensing drive signal, write a reference voltage signal to the drive circuit, or read a sensing voltage signal from the drive circuit.

3. The display panel according to claim 2, wherein the pixel drive circuit further comprises a charge storage circuit, and the charge storage circuit is further connected to the light-emitting unit and configured to store the data signal and the reference voltage signal which are written.

4. The display panel according to claim 2, further comprising N+1 gate lines arranged in sequence, wherein the N+1 gate lines are connected to the N+1 output terminals of the gate drive circuit in one-to-one correspondence, respectively;

data write circuits of the (2x−1)-th row of sub-pixel units are connected to the first output terminal of the (x)-th stage of shift register unit through a (2x−1)-th gate line; and sensing circuits of the (2x−1)-th row of sub-pixel units and data write circuits of the (2x)-th row of sub-pixel units are connected to the second output terminal of the (x)-th stage of shift register unit through a (2x)-th gate line.

5. The display panel according to claim 4, wherein the array comprises M columns, and the display panel further comprises M data lines and M sensing lines;

data write circuits in an (m)-th column of sub-pixel units are connected to an (m)-th data line to receive the data signal; and sensing circuits in the (m)-th column of sub-pixel units are connected to an (m)-th sensing line to receive the reference voltage signal or output the sensing voltage signal, wherein $1 \leq m \leq M$, M is an integer greater than or equal to 2.

6. The display panel according to claim 5, wherein the data write circuit comprises a scan transistor, the drive circuit comprises a drive transistor, the sensing circuit comprises a sensing transistor, and the charge storage circuit comprises a storage capacitor;

a gate electrode of the scan transistor is connected to a first gate line of the N+1 gate lines to receive the scan drive signal, a first electrode of the scan transistor is connected to one of the M data lines to receive the data signal, and a second electrode of the scan transistor is connected to a gate electrode of the drive transistor;

a first electrode of the drive transistor is connected to a first voltage terminal to receive a first drive voltage for generating the drive current, a second electrode of the drive transistor is connected to a first electrode of the sensing transistor;

a gate electrode of the sensing transistor is connected to a second gate line of the N+1 gate lines to receive the sensing drive signal, and a second electrode of the sensing transistor is configured to be connected to one of the M sensing lines to receive the reference voltage signal or output the sensing voltage signal; and a first electrode of the storage capacitor is connected to the gate electrode of the drive transistor, and a second electrode of the storage capacitor is connected to the second electrode of the drive transistor.

7. The display panel according to claim 1, wherein each of the plurality of shift register units comprises a first input circuit, a second input circuit, and an output circuit;
the first input circuit is connected to a first node and configured to, in response to a first input signal, control a level of the first node;
the output circuit is connected to the first node and configured to, under control of the level of the first node, output a first output signal as the gate scan signal from the first output terminal and output a second output signal as the gate scan signal from the second output terminal; and
the second input circuit is connected to the first node and is configured to, under control of a selection control signal and a second input signal, control the level of the first node.

8. The display panel according to claim 7, wherein the output circuit further comprises a shift output terminal, and the output circuit is configured to output a shift signal to a shift register unit cascaded with the (x)-th stage of shift register unit.

9. The display panel according to claim 8, wherein the output circuit comprises a first output transistor, a second output transistor, a third output transistor, a second capacitor, and a third capacitor;
a gate electrode of the first output transistor is connected to the first node, a first electrode of the first output transistor is connected to a first clock signal terminal to receive a first clock signal, and a second electrode of the first output transistor is connected to the first output terminal to output the first output signal;
a gate electrode of the second output transistor is connected to the first node, a first electrode of the second output transistor is connected to a second clock signal terminal to receive a second clock signal, and a second electrode of the second output transistor is connected to the second output terminal to output the second output signal;
a gate electrode of the third output transistor is connected to the first node, a first electrode of the third output transistor is connected to a third clock signal terminal to receive a third clock signal, and a second electrode of the third output transistor is connected to the shift output terminal to output the shift signal;
a first terminal of the second capacitor is connected to the first clock signal terminal, and a second terminal of the second capacitor is connected to the first output terminal; and
a first terminal of the third capacitor is connected to the second clock signal terminal, and the second terminal of the third capacitor is connected to the second output terminal.

10. The display panel according to claim 8, wherein each of the plurality of shift register units further comprises a first control circuit and a first noise reduction circuit;
the first control circuit is connected to the first node and a second node, and is configured to, under control of the level of the first node and a second voltage, control a level of the second node; and
the first noise reduction circuit is connected to the second node, the first node, the first output terminal, the second output terminal, and the shift output terminal, and is configured to, under control of the level of the second node, reset the first node, the first output terminal, the second output terminal, and the shift output terminal.

11. The display panel according to claim 8, wherein each of the plurality of shift register units further comprises a second control circuit and a third control circuit;
the second control circuit is connected to a second node, and is configured to, in response to a fourth clock signal, control a level of the second node; and
the third control circuit is connected to the second node, and is configured to, in response to the first input signal, control the level of the second node.

12. The display panel according to claim 7, wherein the second input circuit comprises a selection control circuit, a third input circuit, and a transmission circuit;
the selection control circuit is connected to a third node and is configured to, in response to the selection control signal, control a level of the third node by a second input signal and maintain the level of the third node;
the third input circuit is connected to the third node and a fourth node, and is configured to, under control of the level of the third node, control a level of the fourth node; and
the transmission circuit is electrically connected to the first node and the fourth node, and is configured to, under control of the level of the fourth node or a first transmission signal, control the level of the first node.

13. The display panel according to claim 1,
wherein a first stage of the shift register unit comprises a first output terminal and a second output terminal which serve as a first output terminal and a second output terminal among the N+1 output terminals arranged in sequence, respectively,
the first output terminal of the first stage of shift register unit is connected to the pixel drive circuits of a first row of sub-pixel units to provide the gate scan signal as the scan drive signal; and
the second output terminal of the first stage of shift register unit is connected to pixel drive circuits of a second row of sub-pixel units to provide the gate scan signal as the scan drive signal, and is connected to sensing circuits of the first row of sub-pixel units to provide the gate scan signal as the sensing drive signal.

14. The display panel according claim 13,
wherein in a case where N is an even number greater than or equal to 2, a last stage of shift register unit comprises a first output terminal which serves as an (N+1)-th output terminal among the N+1 output terminals arranged in sequence, and is connected to sensing circuits of a last row of sub-pixel units to provide the gate scan signal as the sensing drive signal; and
in a case where N is an odd number greater than or equal to 2, the last stage shift register unit comprises a first output terminal and a second output terminal which serve as an (N)-th output terminal and the (N+1)-th output terminal among the N+1 output terminals arranged in sequence, respectively, the first output terminal of the last stage of shift register unit is connected to pixel drive circuits of an (N)-th row of sub-pixel units to provide the gate scan signal as the scan drive signal, and is connected to sensing circuits of an (N−1)-th row of sub-pixel units to provide the gate scan signal as the sensing drive signal, and the second output terminal of the last stage of shift register unit is connected to the sensing circuits of the last row of sub-pixel units to provide the gate scan signal as the sensing drive signal.

15. A display device, comprising the display panel according to claim 1.

16. A drive method for driving the display panel according to claim 1, comprising a display phase of one frame and a blanking phase of one frame,
   wherein in the display phase, the gate drive circuit sequentially outputs gate scan signals to the N rows of sub-pixel units, so that pixel drive circuits in the N rows of sub-pixel units drive light-emitting units in the N rows of sub-pixel units to emit light, respectively; and
   in the blanking phase, an (i)-th row of sub-pixel units are randomly selected from the N rows of sub-pixel units, so that sensing circuits in the (i)-th row of sub-pixel units senses,
   wherein 1≤i≤N.

17. The drive method according to claim 16, wherein in the display phase, a drive cycle of each row of sub-pixel units in the N rows of sub-pixel units comprises a data write phase, a holding phase, and a light-emitting phase, and the pixel drive circuit comprises a data write circuit, a drive circuit, and a charge storage circuit,
   in the data write phase, the data write circuit and the sensing circuit are turned on, and a data signal and a reference voltage signal are respectively written through the data write circuit and the sensing circuit;
   in the holding phase, the data write circuit is turned off, and the sensing circuit is turned on, so that the charge storage circuit holds the data signal and the reference voltage signal; and
   in the light-emitting phase, the data write circuit and the sensing circuit are turned off, the drive circuit is turned on, and the drive circuit drives the light-emitting unit to emit light according to the data signal.

18. The drive method according to claim 16, wherein in the blanking phase, a drive cycle of an (i)-th row of sub-pixel units comprises a reset phase, a resetting phase, a charging phase, and a sensing phase, and the pixel drive circuit comprises a data write circuit, a drive circuit, and a charge storage circuit, in a case of performing sensing on the (i)-th row of sub-pixel units,
   in the reset phase, drive circuits in an (i−1)-th row of sub-pixel units are turned off;
   in the resetting phase, data write circuits and sensing circuits in the (i)-th row of sub-pixel units are turned on, and a data signal and a reference voltage signal are respectively written through the data write circuit and the sensing circuit to turn on drive circuits in the (i)-th row of sub-pixel unit;
   in the charging phase, the data write circuits in the (i)-th row of sub-pixel unit are turned off, the sensing circuits in the (i)-th row of sub-pixel units are turned on, and the sensing circuits are charged by the drive circuits; and
   in the sensing phase, the data write circuits in the (i)-th row of sub-pixel units are turned off, the sensing circuits in the (i)-th row of sub-pixel units are turned on, and a sensing voltage signal is output through the sensing circuit.

19. The drive method according to claim 18, wherein in the reset phase, data write circuits and sensing circuits in the (i−1)-th row of sub-pixel units are turned on, and correction voltages are respectively written through the data write circuits and the sensing circuits to turn off drive circuits in the (i−1)-th t row of sub-pixel units.

* * * * *